(12) United States Patent
Jang et al.

(10) Patent No.: US 11,764,238 B2
(45) Date of Patent: Sep. 19, 2023

(54) IMAGE SENSING DEVICE

(71) Applicant: SK hynix Inc., Icheon-si (KR)

(72) Inventors: Jae Hyung Jang, Icheon-si (KR); Hyung June Yoon, Icheon-si (KR); Jong Chae Kim, Icheon-si (KR); Hoon Moo Choi, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 212 days.

(21) Appl. No.: 17/151,018

(22) Filed: Jan. 15, 2021

(65) Prior Publication Data
US 2021/0408094 A1 Dec. 30, 2021

(30) Foreign Application Priority Data
Jun. 26, 2020 (KR) .................. 10-2020-0078346

(51) Int. Cl.
*H01L 27/146* (2006.01)

(52) U.S. Cl.
CPC .. *H01L 27/14612* (2013.01); *H01L 27/14603* (2013.01); *H01L 27/14643* (2013.01)

(58) Field of Classification Search
CPC ......... H01L 27/14612; H01L 27/14603; H01L 27/14643
See application file for complete search history.

(56) References Cited

U.S. PATENT DOCUMENTS

| 2008/0129841 | A1 | 6/2008 | Dosluoglu et al. |
| 2011/0273597 | A1 | 11/2011 | Ishiwata |
| 2011/0298785 | A1* | 12/2011 | Al-Dahle ............. G02F 1/1337 257/E33.053 |
| 2014/0339606 | A1* | 11/2014 | Lin .................. H01L 27/14621 438/70 |

(Continued)

FOREIGN PATENT DOCUMENTS

| CN | 1961347 A | 5/2007 |
| CN | 106574973 A | 4/2017 |

(Continued)

OTHER PUBLICATIONS

Office Action dated May 18, 2023 for Chinese Patent Application No. 202110023940.2 (8 pages).

*Primary Examiner* — Thao X Le
*Assistant Examiner* — Sean Ayers Winters
(74) *Attorney, Agent, or Firm* — Perkins Coie LLP

(57) ABSTRACT

An image sensing device is provided to include a pixel array of unit pixels, each pixel structured to respond to incident light to produce photocharges and including different photosensing sub-pixels at different locations within the unit pixel to detect incident light, different detection structures formed at peripheral locations of the different photosensing sub-pixels of the unit pixel, respectively, and configured to receive the photocharges that are generated by the different photosensing sub-pixels of and are carried by a current in the unit pixel, a unit pixel voltage node located at a center (Continued)

portion of the unit pixel and electrically coupled to electrically bias an electrical potential of the different photosensing sub-pixels, and a control circuit coupled to the different detection structures of the unit pixel to supply sub-pixel detection control signals to the different detection structures of the unit pixel, respectively.

19 Claims, 14 Drawing Sheets

(56) References Cited

U.S. PATENT DOCUMENTS

| | | |
|---|---|---|
| 2014/0339615 A1 | 11/2014 | Wang et al. |
| 2016/0178749 A1* | 6/2016 | Lin .......................... G01S 17/08 |
| | | 348/302 |
| 2016/0249002 A1 | 8/2016 | Kim et al. |
| 2019/0148448 A1* | 5/2019 | Lee ................... H01L 27/14627 |
| | | 257/431 |

FOREIGN PATENT DOCUMENTS

| | | |
|---|---|---|
| CN | 106713789 A | 5/2017 |
| CN | 107786822 A | 3/2018 |
| CN | 108347551 A | 7/2018 |
| CN | 109786403 A | 5/2019 |
| JP | 2015215525 A | 12/2015 |
| KR | 10-2020-0009643 A | 1/2020 |
| KR | 10-2020-0010045 A | 1/2020 |
| WO | 2019245300 A1 | 12/2019 |

* cited by examiner

IMAGE SENSING DEVICE

CROSS-REFERENCE TO RELATED APPLICATION

This patent document claims the priority and benefits of Korean patent application No. 10-2020-0078346, filed on Jun. 26, 2020, the disclosure of which is incorporated by reference in its entirety as part of the disclosure of this patent document.

TECHNICAL FIELD

The technology and implementations disclosed in this patent document generally relate to an image sensing device, and more particularly to an image sensing device for sensing a distance to a target object.

BACKGROUND

An image sensor is used in electronic devices to capture optical images by converting light into electrical signals using a semiconductor material that react to light. With the recent development of automotive, medical, computer and communication industries, the demand for high-performance image sensors has been increasing in various electronic devices such as smartphones, digital cameras, game consoles, Internet of Things (IoT), robots, surveillance cameras, medical micro-cameras, etc.

Image sensors may be broadly classified into CCD (Charge Coupled Device)-based image sensors and a CMOS (Complementary Metal Oxide Semiconductor)-based image sensors. CCD image sensors create high-quality, low-noise images, and traditionally have advantages over the CMOS image sensor in terms of noise characteristics. However, CMOS image sensors are now widely used due to certain advantages over the CCD counterparts, including, e.g., higher frame rates and shutter speed.

In addition, CMOS image sensors and signal processing circuitry can be integrated into a single chip, making it possible to miniaturize electronic devices while achieving lower power consumption. Further, using the CMOS fabrication technology can result in reduction in the production costs. Such characteristics of the CMOS image sensors make these sensors better suited for implementations in mobile devices.

There have been much developments and studies for measuring range and depth (i.e., a distance to a target object) using image sensors. For example, demand for the technologies of measuring range and depth have been increasing in various devices, for example, security devices, medical devices, automobiles, game consoles, virtual reality (VR)/augmented reality (AR) devices, mobile devices, etc. Methods for measuring depth information using one or more image sensors are mainly classified into a triangulation method, a Time of Flight (TOF) method, and an interferometry method. Among the above-mentioned depth measurement methods, the Time of Flight (TOF) method becomes popular because of its wide range of utilization, high processing speed, and cost advantages. The TOF method measures a distance using emitted light and reflected light.

The TOF method may be mainly classified into a direct method and an indirect method, depending on whether it is a round-trip time or the phase difference that determines the distance. The direct method may calculate a round trip time, and may measure the distance to a target object using the calculated round trip time. The indirect method may measure the distance to the target object using a phase difference. The direct method is suitable for measuring a long-distance measurement and thus is widely used in automobiles. The indirect method is suitable for measuring a short-distance measurement and thus is widely used in various higher-speed devices designed to operate at a higher speed, for example, game consoles, mobile cameras, or others. As compared to the direct type TOF systems, the indirect method has several advantages including having a simpler circuitry, low memory requirement, and a relatively lower costs.

A Current-Assisted Photonic Demodulator (CAPD) method is one type of pixel circuitry used in an indirect TOF sensor. In CAPD, electrons are generated in a pixel circuit by a majority current that is created through an application of a substrate voltage, and the generated electrons are detected by using a difference in potential between electric fields. Since the CAPD method is designed to use the majority current, the CAPD method can more quickly detect electrons. In addition, the CAPD has an excellent efficiency by detecting some electrons formed at a deep depth.

SUMMARY

Various embodiments of the disclosed technology relate to an image sensing device provided with pixels including an electron detection structure optimized for a smaller-sized product.

In one aspect, an image sensing device is provided to include first to fourth sub-pixels arranged in a (2×2) matrix to form a unit pixel; first to fourth taps disposed at vertex points of the unit pixel, respectively; and a fifth tap disposed at a center portion of the unit pixel, wherein each of the first to fourth taps are configured to capture photocharges that generate a hole current in a substrate, are generated by incident light, and move by the hole current; and the fifth tap is configured to control flow of the hole current upon receiving an electric field control signal.

In another aspect, an image sensing device may include a pixel array of unit pixels, each pixel structured to respond to incident light to produce photocharges indicative of detected incident light and including different photosensing sub-pixels at different locations within the unit pixel to detect incident light, different detection structures formed at peripheral locations of the different photosensing sub-pixels of the unit pixel, respectively, and configured to receive the photocharges that are generated by the different photosensing sub-pixels of and are carried by a current in the unit pixel, a unit pixel voltage node located at a center portion of the unit pixel and electrically coupled to electrically bias an electrical potential of the different photosensing sub-pixels and a control circuit coupled to the different detection structures of the unit pixel to supply sub-pixel detection control signals to the different detection structures of the unit pixel, respectively and coupled to the unit pixel voltage node to supply an electrical field control signal.

In some implementations, each of the detection structures formed at peripheral locations of the different photosensing sub-pixels of the unit pixel includes a control node to receive a corresponding sub-pixel detection control signal for the unit pixel, and a at least one detection node adjacent to the control node.

In some implementations, the control circuit is structured to cause each sub-pixel detection control signal to have either an activation voltage or a deactivation voltage.

In some implementations, the electric field control signal has a voltage that is between the deactivation voltage and the activation voltage.

In some implementations, the voltage of the electric field control signal is an average value of the activation voltage and the deactivation voltage.

In some implementations, the image sensing device further includes a light source to produce illumination light to illuminate a target object to be imaged by the pixel array by detecting returned light from the target object under illumination by the illumination light, the unit pixel includes four sub-pixels that are arranged in a 2×2 matrix array, the control circuit is coupled to the light source to apply a light modulation signal to modulate the illumination light and is further structured to apply a first sub-pixel detection control signal to the detection structure for a first sub pixel of the unit pixel to have a substantially same phase as the light modulation signal for generating modulated light applied to the target object, a second sub-pixel detection control signal to the detection structure for a second sub pixel of the unit pixel to have a phase difference of 180° with respect to the light modulation signal, a third sub-pixel detection control signal to the detection structure for a third sub pixel of the unit pixel to have a phase difference of 90° with respect to the light modulation signal, a fourth sub-pixel detection control signal to the detection structure for a fourth sub pixel of the unit pixel to have a phase difference of 270° with respect to the light modulation signal.

In some implementations, each control node has a circular shape and each detection node has a shape that is one of a trapezoid, a rectangle, or a triangle.

In some implementations, the image sensing device further includes an isolation region disposed between adjacent detection nodes In some implementations, the isolation region is doped with impurities having a dopant type opposite to a dopant type of a detection node.

In some implementations, the image sensing device further includes a grid structure extending along a boundary between adjacent sub-pixels included in the unit pixel, and configured to reflect or absorb the incident light.

In some implementations, a width of the grid structure in a region extending along the boundary between the adjacent sub-pixels is less than a horizontal length and a vertical length of the detection structure.

In some implementations, the grid structure includes a region extending to overlap with the detection structures.

In some implementations, each photosensing sub-pixel of the unit pixel includes a pixel transistor region including transistors for processing the photocharges captured by the detection node for the photosensing sub-pixel, and wherein different pixel transistor regions of the photosensing sub-pixels of the unit pixel are symmetrically arranged with respect to a boundary between the sub-pixels.

In another aspect, an image sensing device is provided to include: a voltage reception node disposed at a center portion of the unit pixel in which sub-pixels are arranged in a (2×2) matrix; control nodes disposed at vertex points of the unit pixel, respectively; and detection nodes respectively disposed around the control nodes, and configured to capture photocharges generated by incident light, wherein the photocharges move along flow of a hole current generated in a substrate by the control nodes; and the voltage reception node is configured to control flow of the hole current.

In another aspect, an image sensing device may include a unit pixel including pixels and having sides and vertex points connecting two adjacent sides, the unit pixel configured to generate photocharges in response to a reception of incident light, control nodes disposed at the vertex points of the unit pixel and configured to receive first control signals that generate a hole current in a substrate such that the photocharges move along a flow of the hole current, a voltage reception node disposed at a center portion of the unit pixel and configured to receive a second control signal that controls the flow of the hole current and detection nodes respectively located around the control nodes and configured to capture the photocharges.

In some implementations, wherein the 4 sub-pixels of the unit pixel are arranged in a 2×2 matrix array.

In some implementations, the first control signals correspond to demodulation control signals having either an activation voltage or a deactivation voltage.

In some implementations, the second control signal corresponds to an electric field control signal that has a value between the activation voltage and the deactivation voltage.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
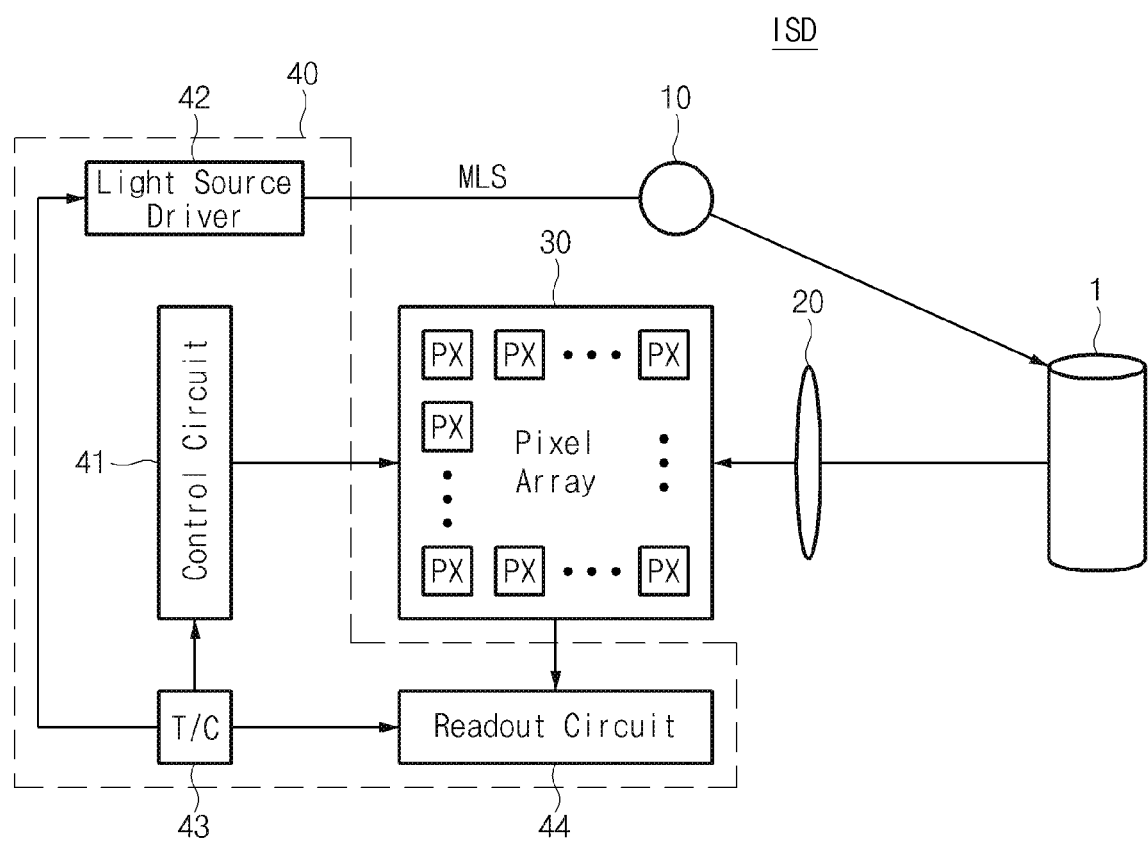
FIG. 1 is a block diagram illustrating an example of an image sensing device based on some implementations of the disclosed technology.

This patent document provides implementations and examples of an image sensing device and the disclosed features may be implemented to substantially address one or more issues due to limitations and disadvantages of various image sensing devices. Some implementations of the disclosed technology relate to an image sensing device provided with pixels including an electron detection structure optimized for a smaller-sized product. The disclosed technology provides various implementations of an image sensing device provided with pixels including an electron detection structure, which can allow unit pixels to receive an electric field control signal, and can control flow of a hole current using the electric field control signal, resulting in higher electron detection efficiency and higher detection speed.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings.

FIG. 1 is a block diagram illustrating an example of an image sensing device ISD based on some implementations of the disclosed technology.

Referring to FIG. 1, the image sensing device ISD may measure the distance to a target object 1 using the Time of Flight (TOF) method. The image sensing device ISD may include a light source 10, a lens module 20, a pixel array 30, and a control circuit 40.

The light source 10 may emit light to a target object 1 upon receiving a light modulation signal MLS (modulated light signal) from the control circuit 40. The light source 10 may be a laser diode (LD) or a light emitting diode (LED) for emitting light (e.g., near infrared (NIR) light, infrared (IR) light or visible light) having a specific wavelength band, or may be any one of a Near Infrared Laser (NIR), a point light source, a monochromatic light source combined with a white lamp or a monochromator, and a combination of other laser sources. For example, the light source 10 may emit infrared light having a wavelength of 800 nm to 1000 nm. Light emitted from the light source 10 may be light (i.e., modulated light) modulated by a predetermined frequency. Although FIG. 1 shows only one light source 10 for convenience of description, the scope or spirit of the disclosed technology is not limited thereto, and a plurality of light sources may also be arranged in the vicinity of the lens module 20.

The lens module 20 may collect light reflected from the target object 1, and may allow the collected light to be focused onto pixels (PXs) of the pixel array 30. For example, the lens module 20 may include a focusing lens having a surface formed of glass or plastic or another cylindrical optical element having a surface formed of glass or plastic. The lens module 20 may include a plurality of lenses that is arranged to be focused upon an optical axis.

The pixel array 30 may include unit pixels (PXs) consecutively arranged in a two-dimensional (2D) matrix structure in which unit pixels are arranged in a column direction and a row direction perpendicular to the column direction. The unit pixels (PXs) may be formed over a semiconductor substrate. Each unit pixel (PX) may convert incident light received through the lens module 20 into an electrical signal corresponding to the amount of incident light, and may thus output a pixel signal using the electrical signal. In this case, the pixel signal may not indicate the color of the target object 1, and may be a signal indicating the distance to the target object 1.

Each unit pixel (PX) may be a Current-Assisted Photonic Demodulator (CAPD) pixel. The structure and operations of each unit pixel (PX) will hereinafter be described with reference to the drawings from FIG. 2.

Each unit pixel (PX) may include a plurality of sub-pixels. The sub-pixels may be arranged in a matrix shape, and may form the unit pixel (PX). The unit pixel (PX) may be a minimum unit that is repeatedly arranged in the same shape within the pixel array.

The control circuit 40 may emit light to the target object 1 by controlling the light source 10, may process each pixel signal corresponding to light reflected from the target object 1 by driving unit pixels (PXs) of the pixel array 30, and may measure the distance to the surface of the target object 1 using the processed result.

The control circuit 40 may include a control circuit 41, a light source driver 42, a timing controller 43, and a readout circuit 44.

The control circuit 41 may drive unit pixels (PXs) of the pixel array in response to a timing signal generated from the timing controller 43. For example, the control circuit 41 may generate a control signal capable of selecting and controlling at least one row line from among the plurality of row lines. The control signal may include a demodulation control signal for generating a hole current in the substrate, a reset signal for controlling a reset transistor, a transmission (Tx) signal for controlling transmission of photocharges accumulated in a detection node, a floating diffusion (FD) signal for providing additional electrostatic capacity at a high illuminance level, a selection signal for controlling a selection transistor, and the like.

Although FIG. 1 illustrates the control circuit 41 arranged in a column direction (i.e., a vertical direction) of the pixel array 30 for convenience of description, at least some parts (e.g., a circuit for generating a demodulation control signal) of the control circuit 41 may be arranged in a row direction (i.e., a horizontal direction) of the pixel array 30.

The light source driver 42 may generate a light modulation signal MLS capable of driving the light source 10 in response to a control signal from the timing controller 43. The light modulation signal MLS may be a signal that is modulated by a predetermined frequency.

The timing controller 43 may generate a timing signal to control the control circuit 41, the light source driver 42, and the readout circuit 44.

The readout circuit 44 may process pixel signals received from the pixel array 30 under control of the timing controller 43, and may thus generate pixel data formed in a digital signal shape. To this end, the readout circuit 44 may include a correlated double sampler (CDS) circuit for performing correlated double sampling (CDS) on the pixel signals generated from the pixel array 30.

In addition, the readout circuit 44 may include an analog-to-digital converter (ADC) for converting output signals of the CDS circuit into digital signals. In addition, the readout circuit 44 may include a buffer circuit that temporarily stores pixel data generated from the analog-to-digital converter (ADC) and outputs the pixel data under control of the timing controller 43. In the meantime, since the pixel array 30 includes CAPD pixels, two column lines for transmitting the pixel signal may be assigned to each column of the pixel array 30, and structures for processing the pixel signal generated from each column line may be configured to correspond to the respective column lines.

The light source 10 may emit light (i.e., modulated light) modulated by a predetermined frequency to a scene captured by the image sensing device ISD. The image sensing device ISD may sense modulated light (i.e., incident light) reflected from the target objects 1 included in the scene, and may thus generate depth information for each unit pixel (PX).

A time delay based on the distance between the image sensing device ISD and each target object 1 may occur between the modulated light and the incident light. The time delay may be denoted by a phase difference between the signal generated by the image sensing device ISD and the light modulation signal MLS controlling the light source 10. An image processor (not shown) may calculate a phase difference generated in the output signal of the image sensing device ISD, and may thus generate a depth image including depth information for each unit pixel (PX).

Figure 2:
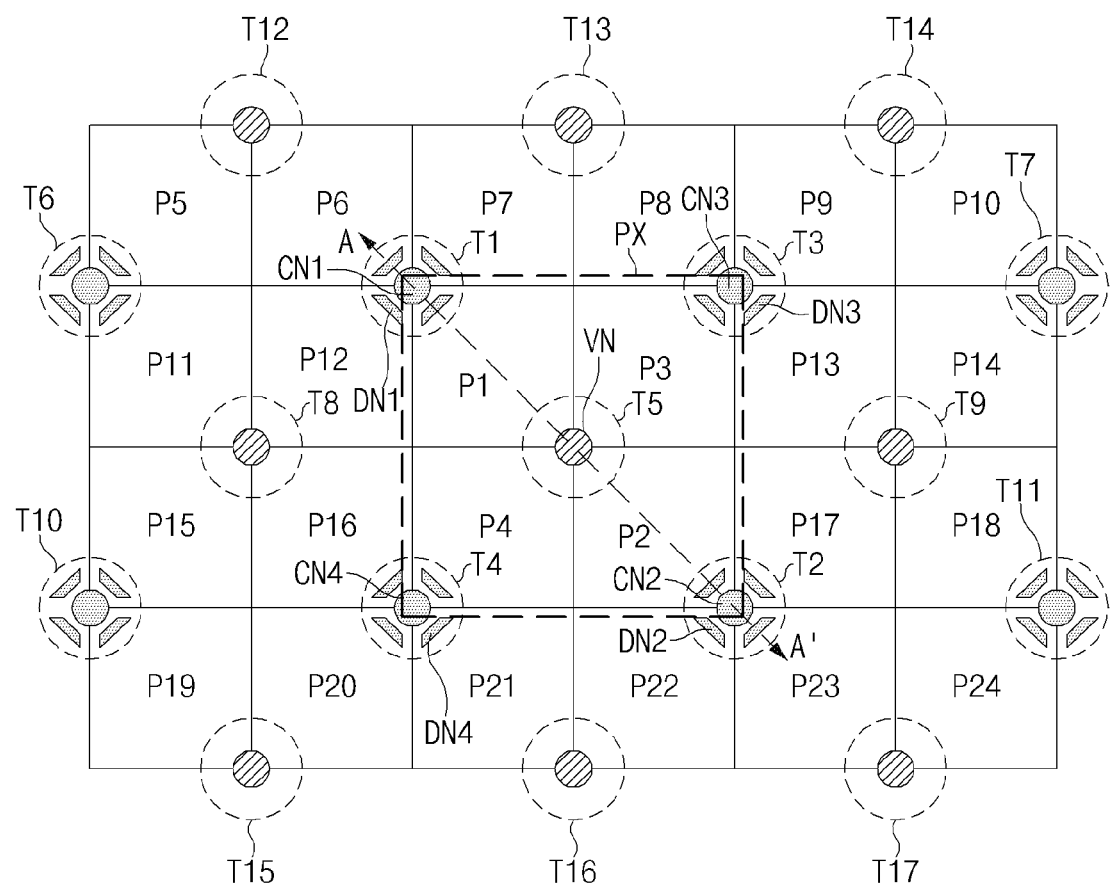
FIG. 2 is a schematic diagram illustrating an example of a pixel array shown in FIG. 1 based on some implementations of the disclosed technology.

FIG. 2 is a schematic diagram illustrating an example of the pixel array 30 shown in FIG. 1 based on some implementations of the disclosed technology.

Referring to FIG. 2, one example of the pixel array 30 is illustrated to include an array of unit pixels (PXs) arranged in rows and columns and each unit pixel includes different subpixels. FIG. 2 exemplarily illustrates 24 sub-pixels P1 to P24 arranged in a matrix shape including four rows and six columns and three full unit pixels (PXs) in the pixel array 30 are show. In specific applications, the number of unit pixels in the pixel array 30 and the number of subpixels can be designed to different numbers depending on the needs of specific sensor applications.

Each sub-pixel (P1 to P24) includes photoelectric conversion regions. The photoelectric conversion regions may absorb incident light, and may produce photocharges (i.e. signal carriers) corresponding to amount of incident light. The photoelectric conversion regions may be implemented in various configurations, including, for example, a photodiode (e.g., an inorganic photodiode), a phototransistor, a photogate, or a pinned photodiode (PPD) or a combination thereof. The produced photocharges can be captured by taps.

Each unit pixel PX includes different sub-pixels denoted by Pn (where 'n' is a positive number). In the illustrated example, each unit pixel PX includes 4 sub-pixels, as illustrated by the unit pixel PX in the center of FIG. 2 which has the sub-pixels P1~P4. The sub-pixels P1~P4 may construct one unit pixel (PX) and each sub-pixel includes at least one photosensing element to convert incident light into photocharges and the photosensing of the four sub-pixels P1~P4 collectively generates the photosensing response of the unit pixel PX. Although the present implementation describes that the unit pixel (PX) includes four sub-pixels P1~P4, the number of sub-pixies included in the unit pixel (PX) is not limited to four and other implementations are also possible.

The pixel array 30 may include a plurality of taps T1~T17 arranged therein.

The following description is directed to an example of a construction of a unit pixel (PX) which has four sides that enclose a rectangular and four vertex points at intersections of the four sides. A first tap T1, a second tap T2, a third tap T3, and a fourth tap T4 may be disposed at vertex points of the unit pixel (PX), respectively. For example, the first tap T1 may be disposed at an upper-left vertex point of the unit pixel (PX), the second tap T2 may be disposed at a lower-right vertex point of the unit pixel (PX), the third tap T3 may be disposed at an upper-right vertex point of the unit pixel (PX), and the fourth tap T4 may be disposed at a lower-left vertex point of the unit pixel (PX).

The photocharges (i.e. signal carriers) produced by photoelectric conversion regions can be captured by the first tap T1, the second tap T2, the third tap T3 and the fourth tap T4. Taps that capture charge may vary depending on the voltage applied to each tap.

The fifth tap T5 may be disposed at a center portion of the unit pixel (PX). In this case, the first tap T1, the second tap T2, the fifth tap T5 may be arranged in a diagonal direction and the third tap T3, the fourth tap T4, the fifth tap T5 may be arranged in another diagonal direction.

In some implementations of the disclosed technology, a certain structure is disposed at the center or vertex point of the unit pixel (PX) when the center point of the certain structure is identical to the center or vertex point of the unit pixel (PX). In some other implementations, the certain structure is disposed at the center or vertex point of the unit pixel (PX) when a part of the certain structure overlaps with the center or vertex point of the unit pixel (PX).

In a situation in which any of sub-pixels P1~P24 included in the pixel array 30 is formed in a rectangular shape and four sub-pixels (e.g., P1, P2, P3, and P4) are arranged in a (2×2) matrix shape to form the unit pixel (PX), the unit pixel (PX) is also formed in a rectangular shape, such that the unit pixel (PX) may include four vertex points, for example, an upper-left vertex point, an upper-right vertex point, a lower-left vertex point, and a lower-right vertex point.

For convenience of description and better understanding of the disclosed technology, the upper-left vertex point of the unit pixel (PX) will hereinafter be referred to as a first vertex point, the lower-right vertex point of the unit pixel (PX) will hereinafter be referred to as a second vertex point, the upper-right vertex point of the unit pixel (PX) will hereinafter be referred to as a third vertex point, and the lower-left vertex point of the unit pixel (PX) will hereinafter be referred to as a fourth vertex point.

The first tap T1, the second tap T2, the third tap T3, and the fourth tap T4 may be respectively disposed at four vertex points of each unit pixel. In addition, the fifth tap T5 may be disposed at the center portion of the unit pixel (PX).

In association with the unit pixel (PX), a diagonal direction from the first vertex point to the second vertex point will hereinafter be defined as a first diagonal direction, and a diagonal direction from the third vertex point to the fourth vertex point will hereinafter be referred to as a second diagonal direction.

The first tap T1, the fifth tap T5, and the second tap T2 may be sequentially arranged in the first diagonal direction in the pixel array 30. In addition, the third tap T3, the fifth tap T5, and the fourth tap T4 may be sequentially arranged in the second diagonal direction in the pixel array 30.

The first to fourth taps T1~T4 or the fifth tap T5 may be sparsely disposed in a row direction (or a horizontal direction) or a column direction (or a vertical direction) of the pixel array 30 without being respectively disposed at consecutive vertex points.

In some implementations, a vertex point where any one of the first to fourth taps T1~T4 is disposed in the row direction (or horizontal direction) or the column direction (or vertical direction) and a vertex point where no tap is disposed in the row or column direction may be alternately arranged.

For example, in association with the unit pixel (PX), a vertex point where the first tap T1 is disposed in the row direction with respect to the first tap T1, a vertex point where no tap is disposed in the row direction with respect to the first tap T1, and a vertex point where the third tap T3 is disposed in the row direction with respect to the first tap T1 may be sequentially arranged. In association with the fifth tap T5, a vertex point where the fifth tap T5 is disposed in the row direction (or horizontal direction) or the column direction (or vertical direction), and a vertex point where the fifth tap T5 is not disposed in the row or column direction may be alternately arranged.

The first tap T1 may include a first control node CN1 and at least one first detection node DN1 surrounding the first control node CN1. The second tap T2 may include a second control node CN2 and at least one second detection node DN2 surrounding the second control node CN2. The third tap T3 may include a third control node CN3 and at least one third detection node DN3 surrounding the third control node CN3. The fourth tap T4 may include a fourth control node CN4 and at least one fourth detection node DN4 surrounding the fourth control node CN4. Although each of the control nodes CN1~CN4 shown in FIG. 2 is formed in a circular shape and each of the detection nodes DN1~DN4 shown in FIG. 2 is formed in a trapezoidal shape for convenience of description, other implementations are also possible. Various examples of the control nodes and the detection nodes will be described later with reference to FIGS. 10 to 11. Each of the detection nodes DN1~DN4 shown in FIG. 2 may be formed in a trapezoidal shape. In more detail, the detection node DN1 may be formed in a trapezoidal shape in which one side contiguous or adjacent to the control node CN1 surrounded by the detection node DN1 is shorter in length than the other side arranged to face the one side. The detection node DN2 may be formed in a trapezoidal shape in which one side contiguous or adjacent to the control node CN2 surrounded by the detection node DN2 is shorter in length than the other side arranged to face the one side. The detection node DN3 may be formed in a trapezoidal shape in which one side contiguous or adjacent to the control node CN3 surrounded by the detection node DN3 is shorter in length than the other side arranged to face the one side. The detection node DN4 may be formed in a trapezoidal shape in which one side contiguous or adjacent to the control node CN4 surrounded by the detection node DN4 is shorter in length than the other side arranged to face the one side. Such trapezoidal shape may enable each of the detection nodes DN1~DN4 to surround each of the control nodes CN1~CN4 included in the same tap in such a manner that as large each detection node DN1~DN4 as possible can be formed to surround each control node CN1~CN4.

In a situation in which as large the detection nodes DN1~DN4 as possible respectively surround the control nodes CN1~CN4, signal carriers that are moving along a hole current formed by each of the control nodes CN1~CN4 can be more easily captured.

The control nodes CN1~CN4 may be disposed at vertex points of the unit pixel (PX), respectively. The detection nodes DN1~DN4 may be arranged to face each other in a first or second diagonal direction with respect to the control nodes CN1~CN4. In addition, each of the detection nodes DN1~DN4 may be partially included in four sub-pixels contiguous or adjacent to each of the control nodes CN1~CN4. In more detail, the detection nodes DN1 may be partially included in four sub-pixels contiguous or adjacent to the control node CN1, the detection nodes DN2 may be partially included in four sub-pixels contiguous or adjacent to the control node CN2, the detection nodes DN3 may be partially included in four sub-pixels contiguous or adjacent to the control node CN3, and the detection nodes DN4 may be partially included in four sub-pixels contiguous or adjacent to the control node CN4.

For example, the control node CN2 of the second tap T2 may be disposed at a lower-right vertex point (i.e., a second vertex point) of the unit pixel (PX), and the detection nodes DN2 of the second tap T2 may be partially included in four sub-pixels P2, P17, P22, and P23.

Differently from the first to fourth taps T1~T4, the fifth tap T5 may not include the control nodes CN1~CN4 and the detection nodes DN1~DN4. Instead, the fifth tap T5 may include a voltage reception node VN through which an electric field control signal is received.

The voltage reception node VN may be disposed at the center portion of the unit pixel (PX). As can be seen from FIG. 2, the voltage reception node VN of the fifth tap T5 may be disposed at the center portion of the control nodes CN1~CN4 of the first to fourth taps T1~T4.

A hole current flowing between the control nodes CN1~CN4 receiving different voltages may increase in proportion to a potential difference between the control nodes CN1~CN4, may increase in inverse proportion to the distance between the control nodes CN1~CN4, and may increase in proportion to the size of the region of each of the facing sides of the control nodes CN1~CN4. In contrast, a hole current flowing between the control nodes CN1~CN4 receiving different voltages may decrease in inverse proportion to a potential difference between the control nodes CN1~CN4, may decrease in proportion to the distance between the control nodes CN1~CN4, and may decrease in inverse proportion to the size of the region of each of the facing sides of the control nodes CN1~CN4.

A hole current may be determined by a potential difference between the control nodes CN1~CN4 and resistance between the control nodes CN1~CN4. The resistance between the control nodes CN1~CN4 may increase in proportion to the distance between the control nodes CN1~CN4, and may also increase in inverse proportion to the size of the region of the facing sides of the control nodes CN1~CN4.

In some implementations, since the electric field control signal is applied to the voltage reception node VN of the fifth tap, a potential gradient between the control nodes CN1~CN4 can be adjusted.

Since the electric field control signal is applied to the voltage reception node VN, additional potential differences between each of the control nodes CN1~CN4 and the voltage reception node VN occur in addition to potential differences due to the demodulation control signal applied to a substrate. The demodulation control signal will be described later with reference to FIGS. 4, 7, and 9.

In implementations, an electric field control signal may be set to correspond to an intermediate voltage between an activation voltage and a deactivation voltage of the demodulation control signal applied to the control nodes CN1~CN4 and this electric field control signal is applied to the voltage reception node VN to cause the path of a flow of a hole current to be adjusted. In addition, a movement path of photocharges generated in a boundary between the contiguous or adjacent unit pixels (PXs) may be adjusted, such that characteristics of the image sensing device ISD can be improved. As electric field control signal is applied to the voltage reception node VN, the hole current may flow toward the voltage reception node located at the center of the unit pixels (PXs). The hole current toward the voltage reception node can prevent undesired crosstalk between two adjacent PXs.

As flow of a hole current between the control nodes CN1~CN4 receiving the demodulation control signal is changed by the electric field control signal, photocharges can be easily detected by the detection nodes DN1~DN4 receiving the demodulation control signal having the activation voltage (e.g., high voltage). In addition, the movement path of photocharges can be adjusted such that the amount of detected photocharges can be increased.

Since the electric field control signal is applied to the voltage reception node VN, there exist not only a voltage difference between the control nodes CN1~CN4 receiving a high-voltage demodulation control signal and a voltage difference between the control nodes CN1~CN4 receiving a low-voltage demodulation control signal, but also an intermediate voltage (i.e., a voltage between the high voltage and the low voltage of the demodulation control signal) additionally occurring at the voltage reception node VN. As a result, a flow passage of a hole current flowing between the control nodes CN1~CN4 may be curved or bent in the direction of the voltage reception node VN. Since the flow passage of a hole current is changed to another passage, the amount of moving photocharges caused by the hole current may increase. A detailed description thereof will be described later with reference to FIGS. 4 to 7.

In some implementations of the disclosed technology, the control node and the detection node included in the first tap T1 will hereinafter be defined as a first control node CN1 and a first detection node DN1, respectively. The control node and the detection node included in the second tap T2 will hereinafter be defined as a second control node CN2 and a second detection node DN2, respectively. The control node and the detection node included in the third tap T3 will hereinafter be defined as a third control node CN3 and a third detection node DN3, respectively. The control node and the detection node included in the fourth tap T4 will hereinafter be defined as a fourth control node CN4 and a fourth detection node DN4, respectively.

Figure 3:
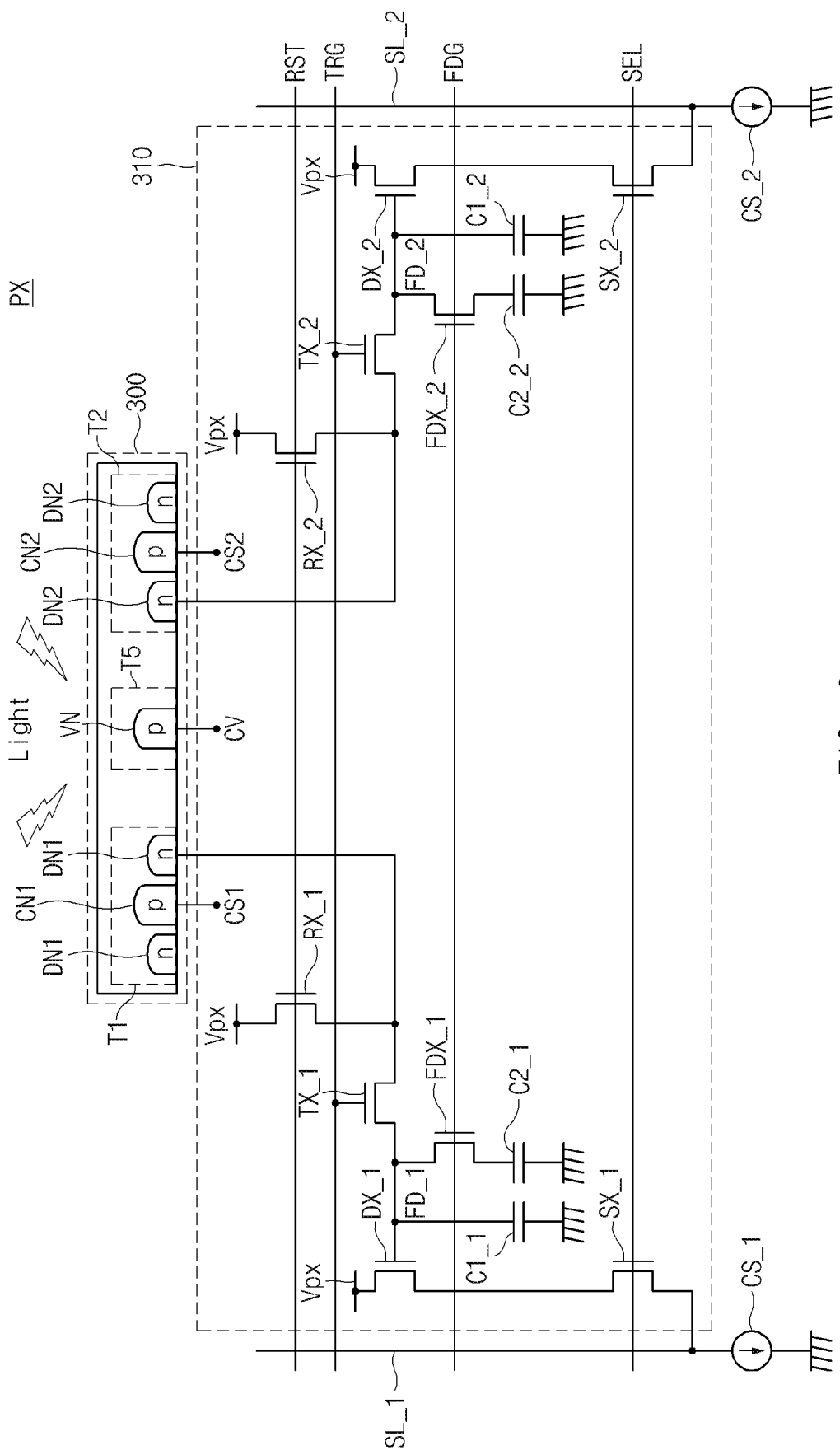
FIG. 3 is a circuit diagram illustrating an example of a unit pixel included in the pixel array shown in FIG. 2 based on some implementations of the disclosed technology.

In FIG. 3, the structure and operations of the unit pixel (PX) will hereinafter be described with reference to the cross-sectional view of the pixel array 30 taken along the first cutting line A-A' shown in FIG. 2 and a plurality of circuits connected to the corresponding region.

FIG. 3 is a circuit diagram illustrating an example of the unit pixel (PX) included in the pixel array shown in FIG. 2 based on some implementations of the disclosed technology.

Referring to FIG. 3, the unit pixel (PX) may include a photoelectric conversion region 300 and a circuit region 310. Although the unit pixel (PX) shown in FIG. 3 will hereinafter be described using the cross-sectional view of the unit pixel (PX) taken along the first cutting line A-A' as an example for convenience of description, the scope or spirit of the disclosed technology is not limited thereto, and the cross-sectional view of the unit pixel (PX) taken along the second diagonal direction shown in FIG. 2 may also be substantially identical to that of the photoelectric conversion region 300 shown in FIG. 3 as necessary.

In addition, when another unit pixel (including the sub-pixels P11, P12, P15, and P16) shown in FIG. 2 is taken along the same direction (i.e., the cutting line from the sixth tap T6 to the fourth tap T4), the another unit pixel (including the sub-pixels P11, P12, P15, and P16) shown in FIG. 2 may also be substantially identical in cross-sectional view to the photoelectric conversion region 300 shown in FIG. 3.

FIG. 3 illustrates the cross-sectional view of the unit pixel (PX) taken along the line from the first tap T1 to the second tap T2 from among the plurality of taps included in the pixel array shown in FIG. 2, and as such a detailed description of the unit pixel (PX) shown in FIG. 3 will hereinafter be described centering upon the first tap T1 and the second tap T2.

FIG. 3 illustrates a cross-sectional view of the sub-pixels P1 and P2, each sub-pixels may include the photoelectric conversion regions 300. And each sub-pixels may include each tap. For example, sub-pixel P1 includes the first tap T1 and sub pixel P2 includes second tap T2.

The photoelectric conversion region 300 may correspond to a region that briefly illustrates the cross-sectional view of the pixel array 30 taken along the first cutting line A-A' shown in FIG. 2.

The photoelectric conversion region 300 may include first and second control nodes CN1 and CN2 and first and second detection nodes DN1 and DN2. The first control node CN1 and the first detection nodes DN1 may be included in the construction of the first tap T1, and the second control node CN2 and the second detection nodes DN2 may be included or construct the second tap T2.

In addition, the photoelectric conversion region 300 may include the voltage reception node VN. The voltage reception node VN may be included or construct the fifth tap T5.

The first and second control nodes CN1 and CN2, the first and second detection nodes DN1 and DN2, and the voltage reception node VN may be formed in the substrate. For example, when the substrate is a P-type semiconductor substrate, each of the first and second control nodes CN1 and CN2 may be formed of or include a P-type impurity region, and each of the first and second detection nodes DN1 and DN2 may be formed of an N-type impurity region. In addition, the voltage reception node VN may be formed of or include the same P-type impurity region as in the control nodes CN1 and CN2.

In some implementations, the first and second control nodes CN1 and CN2 may include P-type impurity regions having different doping densities. For example, the P-type impurity region (i.e., $P^-$ region) having a relatively lower doping density may be implanted into the substrate to a first depth, and the P-type impurity region (i.e., $P^+$ region) having a relatively higher doping density may be implanted into the substrate to a second depth at the same position as the above $P^-$-type impurity implantation position. In this case, the first depth may be greater than the second depth.

The first and second detection nodes DN1 and DN2 may include N-type impurity regions having different doping densities. For example, the N-type impurity region (i.e., $N^-$ region) having a relatively lower doping density may be implanted into the substrate to a third depth, and the N-type impurity region (i.e., $N^+$ region) having a relatively higher doping density may be implanted into the substrate to a fourth depth at the same position as the above $N^-$-type impurity implantation position. In addition, the first depth may be greater than the third depth. Flow of the hole current to be applied to the detection nodes DN1 and DN2 may be changed according to a change in the third depth.

The voltage reception node VN may include P-type impurity regions having different doping densities. For example, the P-type impurity region (i.e., $P^-$ region) having a relatively lower doping density may be implanted into the substrate to a fifth depth, and the P-type impurity region (i.e., $P^+$ region) having a relatively higher doping density may be implanted into the substrate to a sixth depth at the same position as the above impurity implantation position. In this case, the fifth depth may be greater than the sixth depth.

In this case, the fifth depth may be smaller than the first depth. When the fifth depth is greater than the first depth, the electric field control signal applied to the voltage reception node VN may operate as a threshold value, such that flow of the hole current may be interrupted. In addition, when the fifth depth is greater than the first depth, resistance between the nodes VN, DN1, and DN2 can be reduced, resulting in occurrence of an unexpected leakage current.

The fifth depth may be experimentally determined according to desired device characteristics, for example, internal resistance, the amount of power consumption, a potential gradient, etc.

In some implementations, the P-type impurity region (i.e., P⁻-type region) having a relatively lower doping density may not be formed in the voltage reception node VN. By adjusting the fifth depth of the voltage reception node VN, the potential gradient formed in the unit pixel (PX) may be adjusted at a reception time of the electric field control signal VS.

The first control node CN1 may be isolated from the first detection nodes DN1, the second control node CN2 may be isolated from the second detection nodes DN2, and the first control node CN1 and the first detection nodes DN1 may be isolated from the second control node CN2 and the second detection nodes DN2.

The first control node CN1 may receive the first demodulation control signal CS1 from the control circuit 41, and the second control node CN2 may receive the second demodulation control signal CS2 from the control circuit 41. A potential difference between the first demodulation control signal CS1 and the second demodulation control signal CS2 may generate an electric field (or a hole current) that controls flow of signal carriers generated in the substrate by incident light.

Each of the first demodulation control signal CS1 and the second demodulation control signal CS2 may have any one of an activation voltage and a deactivation voltage. In this case, the activation voltage and the deactivation voltage may be experimentally determined. For example, the activation voltage may be 1.2 V, and the deactivation voltage may be zero volts (0V).

The tap including the control node to which the demodulation control signal of the activation voltage is received may operate to capture photocharge generated in the photoelectric conversion region 300. The tap including the control node to which the demodulation control signal of the deactivation voltage is received may not operate to capture the photocharge generated in the photoelectric conversion region 300. Thus, the activation voltage and the deactivation voltage may determine whether the tap operates to detect photocharges.

The voltage reception node VN may receive the electric field control signal VS from the control circuit 41. The electric field control signal VS may have a specific voltage corresponding to any of voltages between the activation voltage and the deactivation voltage of the first demodulation control signal CS1 and the second demodulation control signal CS2. For example, assuming that each of the demodulation control signals CS1 and CS2 is set to 1.2 V and the deactivation voltage is set to zero volts (0V), the voltage of the electric field control signal VS may be 0.6V corresponding to an average voltage of two voltages 1.2V and 0V.

Each of the first and second detection nodes DN1 and DN2 may capture and accumulate signal carriers.

The circuit region 310 may include a plurality of elements for processing photocharges captured by the first and second detection nodes DN1 and DN2 and converting the photocharges into an electrical signal. Control signals RST, TRG, FDG, and SEL applied to the plurality of elements may be supplied from the control circuit 41. In addition, a pixel voltage (Vpx) may be a power-supply voltage (VDD) or a source voltage (VSS).

Elements for processing photocharges captured by the first detection node DN1 will hereinafter be described with reference to the attached drawings. The circuit region 310 may include a reset transistor RX_1, a transfer transistor TX_1, a first capacitor C1_1, a second capacitor C2_1, a floating diffusion (FD) transistor FDX_1, a drive transistor DX_1, and a selection transistor SX_1.

The reset transistor RX_1 may be activated to enter an active state in response to a logic high level of the reset signal RST supplied to a gate electrode thereof, such that potential of the floating diffusion (FD) node FD_1 and potential of the first detection node DN1 may be reset to a predetermined level (e.g., the pixel voltage Vpx). In addition, when the reset transistor RX_1 is activated (i.e., active state), the transfer transistor TX_1 can also be activated (i.e., active state) to reset the floating diffusion (FD) node FD_1.

The transfer transistor TX_1 may be activated (i.e., active state) in response to a logic high level of the transfer signal TRG supplied to a gate electrode thereof, such that photocharges accumulated in the first detection node DN1 can be transmitted to the floating diffusion (FD) node FD_1.

The first capacitor C1_1 may be coupled to the floating diffusion (FD) node FD_1, such that the first capacitor C1_1 can provide predefined electrostatic capacity.

The second capacitor C2_1 may be selectively coupled to the floating diffusion (FD) node FD_1 according to operations of the floating diffusion (FD) transistor FDX_1, such that the second capacitor C2_1 can provide additional predefined electrostatic capacity.

Each of the first capacitor C1_1 and the second capacitor C2_1 may include, for example, at least one of a Metal-Insulator-Metal (MIM) capacitor, a Metal-Insulator-Polysilicon (MIP) capacitor, a Metal-Oxide-Semiconductor (MOS) capacitor, and a junction capacitor.

The floating diffusion (FD) transistor FDX_1 may be activated (i.e., active state) in response to a logic high level of the floating diffusion (FD) signal FDG supplied to a gate electrode thereof, such that the floating diffusion (FD) transistor FDX_1 may couple the second capacitor C2_1 to the floating diffusion (FD) node FD_1.

For example, when the amount of incident light is sufficient to correspond to a relatively high illuminance condition, the control circuit 41 may activate the floating diffusion (FD) transistor FDX_1, such that the floating diffusion (FD) transistor FDX_1 enters the active state and the floating diffusion (FD) node FD_1 can be coupled to the second capacitor C2_1. As a result, when the amount of incident light is sufficient to correspond to a high illuminance level, the floating diffusion node FD_1 can accumulate much more photocharges therein, which makes it possible to guarantee a high dynamic range.

On the other hand, when the amount of incident light is not sufficient and thus corresponds to a relatively low illuminance level, the control circuit 41 may control the floating diffusion (FD) transistor FDX_1 to be deactivated (i.e., inactive state), such that the floating diffusion (FD) node FD_1 can be isolated from the second capacitor C2_1.

In some other implementations, the floating diffusion (FD) transistor FDX_1 and the second capacitor C2_1 may be omitted as necessary.

A drain electrode of the drive transistor DX_1 is coupled to the pixel voltage (Vpx) and a source electrode of the drive transistor DX_1 is coupled to a vertical signal line SL_1 through the selection transistor SX_1, such that a load (MOS) and a source follower circuit of a constant current source circuit CS_1 coupled to one end of the vertical signal line SL_1 can be constructed. Thus, the drive transistor DX_1 may output a current corresponding to potential of the floating diffusion node FD_1 coupled to a gate electrode to the vertical signal line SL_1 through the selection transistor SX_1.

The selection transistor SX_1 may be activated (i.e., active state) in response to a logic high level of the selection signal SEL supplied to a gate electrode thereof, such that the pixel signal generated from the drive transistor DX_1 can be output to the vertical signal line SL_1.

In order to process photocharges captured by the second detection node DN2, the circuit region 310 may include a reset transistor RX_2, a transfer transistor TX_2, a first capacitor C1_2, a second capacitor C2_2, a floating diffusion (FD) transistor FDX_2, a drive transistor DX_2, and a selection transistor SX_2. Whereas the elements for processing photocharges captured by the second detection node DN2 may operate at different timing points from those of other elements for processing photocharges captured by the first detection node DN1, the elements for processing photocharges captured by the second detection node DN2 may be substantially identical in terms of structures and operations to the other elements for processing photocharges captured by the first detection node DN_A. Thus, detailed descriptions of the structures and operations will herein be omitted for convenience of description.

The pixel signal transferred from the circuit region 310 to the vertical signal line SL_1 and the pixel signal transferred from the circuit region 310 to the vertical signal line SL_2 may be performed by noise cancellation and analog-to-digital (ADC) conversion processing, such that each of the pixel signals can be converted into image data.

Although each of the reset signal RST, the transmission signal TRG, the floating diffusion (FD) signal FDG, and the selection signal SEL shown in FIG. 3 is denoted by a single signal line, each of the reset signal RST, the transmission signal TRG, the floating diffusion (FD) signal FDG, and the selection signal SEL can be supplied through a plurality of signal lines (e.g., two signal lines). In this case, elements for processing photocharges captured by the first detection node DN1 and the other elements for processing photocharges captured by the second detection node DN2 can operate at different timing points based on signals supplied through the plurality of signal lines.

The image processor (not shown) may calculate first image data acquired from photocharges captured by the first detection node DN1, second image data acquired from photocharges captured by the second detection node DN2, third image data acquired from photocharges captured by the third detection node (not shown), and fourth image data acquired from the photocharges captured by the second detection node (not shown), may calculate a phase difference using the first to fourth image data, may calculate depth information indicating the distance to the target object 1 based on a phase difference corresponding to each pixel, and may generate a depth image including depth information corresponding to each pixel.

FIGS. 4 to 7 are diagrams illustrating examples of operations of the image sensing device configured to detect electrons for each phase based on some implementations of the disclosed technology.

Referring to FIGS. 4 to 7, an operation time of the image sensing device may be divided into four periods, such that the image sensing device may capture photocharges generated in each of the four periods.

A method for capturing photocharges using the image sensing device based on some implementations of the disclosed technology will hereinafter be described with reference to FIGS. 4, 5, 6, 7, and 9. Although the method for capturing photocharges using the above-mentioned image sensing device will hereinafter be described using the sub-pixels P1, P2, P3, and P4 included in the unit pixel (PX) as an example, other implementations are also possible, and the above-mentioned photocharge capturing method can also be applied to other sub-pixels P5~P24 included in the pixel array 30 in substantially the same manner as in the sub-pixels P1, P2, P3, and P4.

In accordance with the image sensing device based on some implementations of the disclosed technology, the operation for capturing photocharges using the image sensing device may be carried out in the photoelectric conversion region 300 throughout first to fourth periods corresponding to different time periods.

The first tap T1, the second tap T2, the third tap T3, and the fourth tap T4 may be disposed at vertex points of the unit pixel (PX), respectively. In addition, the fifth tap T5 may be disposed at the center portion of the unit pixel (PX).

Figure 4:
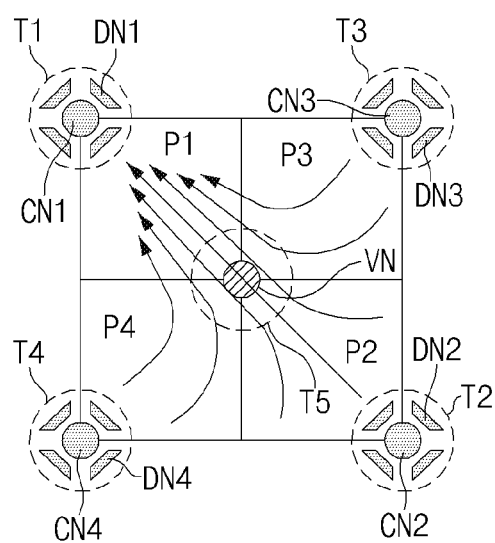
FIGS. 4 to 7 are conceptual diagrams illustrating examples of operations of the image sensing device configured to detect electrons for each phase based on some implementations of the disclosed technology.

Referring to FIG. 4, in the first period, light incident upon the unit pixel (PX) may be processed by photoelectric conversion, such that a pair of an electron and a hole may occur in the substrate according to the amount of incident light. In this case, the control circuit 41 may output the first demodulation control signal CS1 to the first control node CN1, may output the second demodulation control signal CS2 to the second control node CN2, may output the third demodulation control signal CS3 to the third control node CN3, and may output the fourth demodulation control signal CS4 to the fourth control node CN4.

In this case, the first demodulation control signal CS1 may have an activation voltage, and each of the second demodulation control signal CS2, the third demodulation control signal CS3, and the fourth demodulation control signal CS4 may have a deactivation voltage. In addition, in the first period, the control circuit 41 may output the electric field control signal VS to the voltage reception node VN.

An electric field may occur between the first control node CN1 and each of the remaining control nodes CN2, CN3, and CN4 due to a difference in voltage between the first demodulation control signal CS1 and each of the remaining demodulation control signals CS2, CS3, and CS4, and a hole current may flow from the first control node CN1 to the remaining control nodes CN2, CN3, and CN4. That is, since electrons generated in the substrate may move toward the first control node CN1 in response to the amount of incident light, the electrons can be captured by the first detection node DN1 arranged around the first control node CN1.

A hole current path may be changed by the electric field control signal VS applied to the voltage reception node VN, such that the movement path of photocharges may also be changed. The hole current path for use in the image sensing device having no voltage reception node VN will be described later with reference to FIG. 8.

Since the electric field control signal VS applied to the voltage reception node VN has an intermediate voltage between the activation voltage and the deactivation voltage of the demodulation control signal, an additional electric field may occur between the voltage reception node VN and each of the control nodes CN1, CN2, CN3, and CN4, and the flow passage of a hole current flowing from the first control node CN1 receiving the activation voltage to each of the second, third, and fourth control nodes CN2, CN3, and CN4 receiving the deactivation voltage may be curved or bent in the direction of the voltage reception node VN.

Since the electric field control signal VS is applied to the voltage reception node VN, electrons generated in the sub-pixels P1, P2, P3, and P4 may easily move toward the voltage reception node VN due to the changed hole current path, and photocharges having moved toward the voltage reception node VN may easily move back to the first detection node DN1, such that the photocharges can be easily captured.

Figure 5:
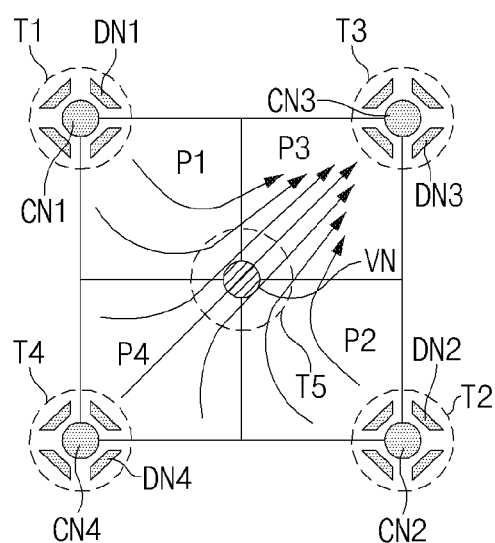

Referring to FIG. 5, in the second period subsequent to the first period, light incident upon the unit pixel (PX) may be processed by photoelectric conversion, such that a pair of an electron and a hole may occur in the substrate according to the amount of incident light. In this case, the control circuit 41 may output the second demodulation control signal CS2 to the second control node CN2, may output the first demodulation control signal CS1 to the first control node CN1, may output the third demodulation control signal CS3 to the third control node CN3, and may output the fourth demodulation control signal CS4 to the fourth control node CN4.

In this case, the second demodulation control signal CS2 may have an activation voltage, and each of the first demodulation control signal CS1, the third demodulation control signal CS3, and the fourth demodulation control signal CS4 may have a deactivation voltage. In addition, in the second period, the control circuit 41 may output the electric field control signal VS to the voltage reception node VN.

The electric field may occur between the second control node CN2 and each of the remaining control nodes CN1, CN3, and CN4 due to a difference in voltage between the second demodulation control signal CS2 and each of the remaining demodulation control signals CS1, CS3, and CS4, and a hole current may flow from the second control node CN2 to the remaining control nodes CN1, CN3, and CN4. That is, since electrons generated in the substrate may move toward the second control node CN2 in response to the amount of incident light, the electrons can be captured by the second detection node DN2 arranged around the second control node CN2.

A hole current path may be changed by the electric field control signal VS applied to the voltage reception node VN, such that the movement path of photocharges may be changed. The hole current path for use in the image sensing device having no voltage reception node VN will be described later with reference to FIG. 8.

When the electric field control signal VS is applied to the voltage reception node VN, this electric field control signal VS causes an additional electric field to be present between the voltage reception node VN and each of the control nodes CN1, CN2, CN3, and CN4. This additional electric field causes a curve or bending in the flow passage of a hole current flowing from the second control node CN2 receiving the activation voltage to each of the first, third, and fourth control nodes CN1, CN3, and CN4 receiving the deactivation voltage in the direction of the voltage reception node VN.

Since the electric field control signal VS is applied to the voltage reception node VN, electrons generated in the sub-pixels P1, P2, P3, and P4 may easily move toward the voltage reception node VN due to the changed hole current path, and photocharges having moved toward the voltage reception node VN may easily move back toward the second detection node DN2, such that the photocharges can be more easily captured to improve the collection or detection of photocharges.

Figure 6:
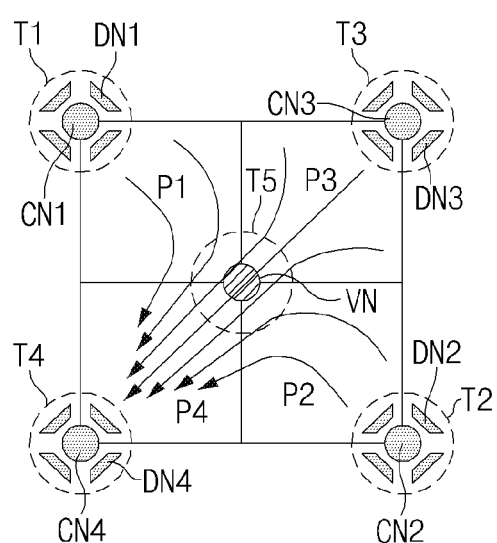

Referring to FIG. 6, in the third period subsequent to the second period, light incident upon the unit pixel (PX) may be processed by photoelectric conversion, such that a pair of an electron and a hole may occur in the substrate according to the amount of incident light. In this case, the control circuit 41 may output the third demodulation control signal CS3 to the third control node CN3, may output the first demodulation control signal CS1 to the first control node CN1, may output the second demodulation control signal CS2 to the second control node CN2, and may output the fourth demodulation control signal CS4 to the fourth control node CN4. In this case, the third demodulation control signal CS3 may have an activation voltage, and each of the first demodulation control signal CS1, the second demodulation control signal CS2, and the fourth demodulation control signal CS4 may have a deactivation voltage. In addition, in the third period, the control circuit 41 may output the electric field control signal VS to the voltage reception node VN.

The electric field may occur between the third control node CN3 and each of the remaining control nodes CN1, CN2, and CN4 due to a difference in voltage between the third demodulation control signal CS3 and each of the remaining demodulation control signals CS1, CS2, and CS4, and a hole current may flow from the third control node CN3 to the remaining control nodes CN1, CN2, and CN4. Since electrons generated in the substrate may move toward the third control node CN3 in response to the amount of incident light, the electrons can be captured by the third detection node DN3 arranged around the third control node CN3.

A hole current path may be changed by the electric field control signal VS applied to the voltage reception node VN, such that the movement path of photocharges may be changed. The hole current path for use in the image sensing device having no voltage reception node VN will be described later with reference to FIG. 8.

Since the electric field control signal VS is applied to the voltage reception node VN, an additional electric field may occur between the voltage reception node VN and each of the control nodes CN1, CN2, CN3, and CN4, and the flow passage of a hole current flowing from the third control node CN3 receiving the activation voltage to each of the first, second, and fourth control nodes CN1, CN2, and CN4 receiving the deactivation voltage may be curved or bent in the direction of the voltage reception node VN.

Since the electric field control signal VS is applied to the voltage reception node VN, electrons generated in the sub-pixels P1, P2, P3, and P4 may easily move toward the voltage reception node VN due to the changed hole current path, and photocharges having moved toward the voltage reception node VN may easily move back toward the third detection node DN3, such that the photocharges can be easily captured.

Figure 7:
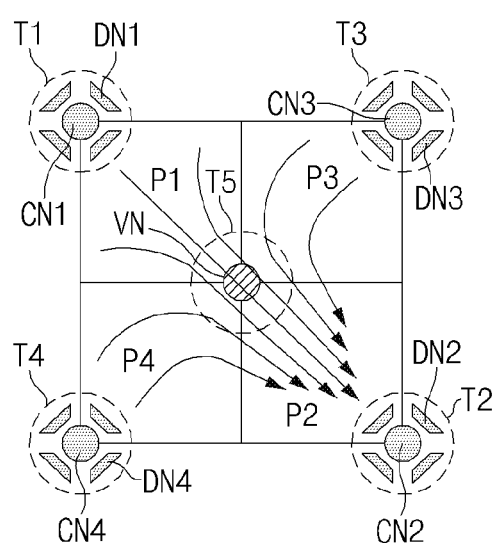

Referring to FIG. 7, in the fourth period subsequent to the third period, light incident upon the unit pixel (PX) may be processed by photoelectric conversion, such that a pair of an electron and a hole may occur in the substrate according to the amount of incident light. In this case, the control circuit 41 may output the fourth demodulation control signal CS4 to the fourth control node CN4, may output the first demodulation control signal CS1 to the first control node CN1, may output the second demodulation control signal CS2 to the second control node CN2, and may output the third demodulation control signal CS3 to the third control node CN3. In this case, the fourth demodulation control signal CS4 may have an activation voltage, and each of the first demodulation control signal CS1, the second demodulation control signal CS2, and the third demodulation control signal CS3 may have a deactivation voltage. In addition, in the fourth period, the control circuit 41 may output the electric field control signal VS to the voltage reception node VN.

The electric field may occur between the fourth control node CN4 and each of the remaining control nodes CN1, CN2, and CN3 due to a difference in voltage between the fourth demodulation control signal CS4 and each of the remaining demodulation control signals CS1, CS2, and CS3, and a hole current may flow from the fourth control node CN4 to the remaining control nodes CN1, CN2, and CN3. Since electrons generated in the substrate may move toward the fourth control node CN4 in response to the amount of incident light, the electrons can be captured by the fourth detection node DN4 arranged around the fourth control node CN4.

A hole current path may be changed by the electric field control signal VS applied to the voltage reception node VN, such that the movement path of photocharges may also be changed. The hole current path for use in the image sensing device having no voltage reception node VN will be described later with reference to FIG. 8.

Since the electric field control signal VS is applied to the voltage reception node VN, an additional electric field may occur between the voltage reception node VN and each of the control nodes CN1, CN2, CN3, and CN4, and the flow passage of a hole current flowing from the fourth control node CN4 receiving the activation voltage to each of the first, second, and third control nodes CN1, CN2, and CN3 receiving the deactivation voltage may be curved or bent in the direction of the voltage reception node VN.

Since the electric field control signal VS is applied to the voltage reception node VN, electrons generated in the sub-pixels P1, P2, P3, and P4 may easily move toward the voltage reception node VN due to the changed hole current path, and photocharges having moved toward the voltage reception node VN may easily move back toward the fourth detection node DN4, such that the photocharges can be easily captured.

Figure 8:
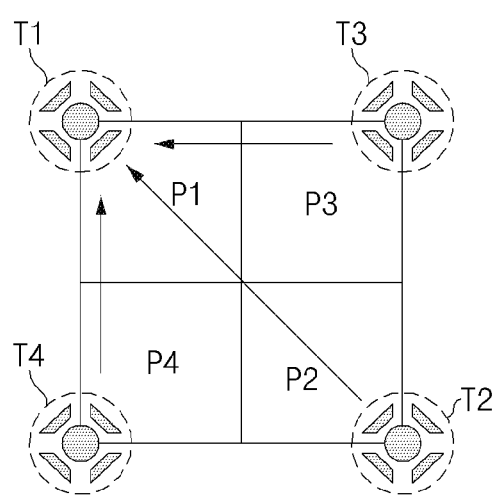
FIG. 8 is a conceptual diagram illustrating an example of electron detection operations of an image sensing device having no fifth tap based on some implementations of the disclosed technology.

FIG. 8 is a diagram illustrating an example of electron detection operations of the image sensing device having no voltage reception node VN based on some implementations of the disclosed technology. In more detail, FIG. 8 illustrates an example of the movement path of photocharges generated by a hole current in the image sensing device configured not to include the voltage reception node VN. The electric field control signal VS corresponding to any of voltages between the activation voltage and the deactivation voltage may not be applied to the image sensing device shown in FIG. 8, such that the movement path of photocharges may be formed in a straight line shape at a boundary between the unit pixels (PXs).

Since photocharges move along the straight movement path in the boundary between the unit pixels (PXs), there may arise crosstalk in which some photocharges generated around the boundary between the unit pixels (PXs) are unavoidably detected in another contiguous or adjacent unit pixel (PX). In contrast, when the electric field control signal VS is applied to the voltage reception node VN, the movement path of photocharges may be curved or bent in the direction of the voltage reception node VN as shown in FIGS. 4 to 7, such that the amount of photocharges moving along a boundary between the unit pixels (PXs) can be reduced, thus improving the detection of photocharges.

In addition, when the intermediate voltage caused by the electric field control signal VS is not applied to the voltage reception node VN of the image sensing device, photocharges may not be collected in the voltage reception node VN, such that photocharges generated in the sub-pixel (e.g., P2 shown in FIG. 8) located far from the control node (e.g., CN1 shown in FIG. 8) receiving a control signal having an activation voltage may not be easily detected by the detection node (e.g., DN1 shown in FIG. 8).

Since the image sensing device based on some implementations of the disclosed technology includes the voltage reception node VN, the intensity and path of a hole current can be changed to facilitate photocharge detection, such that sensitivity of the image sensing device and the processing speed of the image sensing device can be improved.

Figure 9:
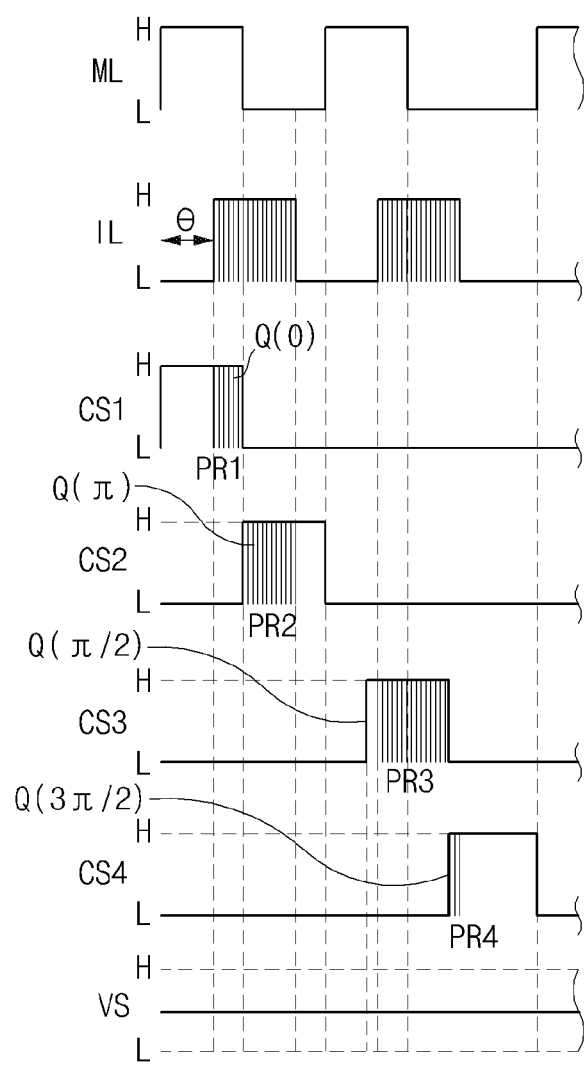
FIG. 9 is a timing diagram illustrating an example of operations of the image sensing device based on some implementations of the disclosed technology.

FIG. 9 is a timing diagram illustrating an example of operations of the image sensing device based on some implementations of the disclosed technology.

FIG. 9 exemplarily illustrates modulated light (ML), incident light (IL), the first to fourth demodulation control signals CS1, CS2, CS3, and CS4, and the electric field control signal CS.

Referring to FIG. 9, the modulated light (ML) may refer to light that is emitted to the target object 1 by the light source 10 controlled by the control circuit 40. The modulated light (ML) may be generated to alternately have a high-level section (i.e., a period in which light is emitted) and a low-level section (i.e., a period in which light is not emitted).

The incident light (IL) may refer to light that is incident upon the substrate to generate electron-hole pairs through photoelectric conversion. The incident light (IL) may have a phase difference ($\theta$) that is changed with the distance between the image sensing device ISD and the target object 1.

The level of each of the modulated light (ML) and the incident light (IL) may refer to the intensity of light.

While electrons generated by the incident light (IL) are captured, each of the first demodulation control signal CS1, the second demodulation control signal CS2, the third demodulation control signal CS3, and the fourth demodulation control signal CS43 may alternately have a deactivation voltage (L) indicating a low level and an activation voltage (H) indicating a high level. For example, the activation voltage of each of the demodulation control signals CS1~CS4 may be set to 1.2 V, and the deactivation voltage of each of the demodulation control signals CS1~CS4 may be set to zero volts (0V).

In addition, the first demodulation control signal CS1 may have the same phase as the modulated light (ML), the second demodulation control signal CS2 may have a phase difference of 180° ($\pi$) with respect to the modulated light (ML), the third demodulation control signal CS3 may have a phase difference of 90° ($\pi/2$) with respect to the modulated light (ML), and the fourth demodulation control signal CS4 may have a phase difference of 270° ($3\pi/2$) with respect to the modulated light (ML).

In some implementations of the disclosed technology, it is assumed that no phase difference occurs between the light modulation signal MLS generating the modulated light (ML) and the modulated light (ML) for convenience of description, such that the light modulation signal MLS and the modulated light (ML) may have the same phase.

In a first period PR1, the first demodulation control signal CS1 may have the activation voltage (H), and each of the second, third, and fourth demodulation control signals CS2, CS3, and CS4 may have the deactivation voltage (L). Therefore, electrons generated by incident light (IL) received in the first period PR1 may move toward the first tap T1 by a hole current, such that the electrons can be captured by the first detection node DN1. In this case, the electrons captured by the first detection node DN1 in the first period PR1 may hereinafter be denoted by "Q(0)".

In a second period PR2, the second demodulation control signal CS2 may have the activation voltage (H), and each of the first, third, and fourth demodulation control signals CS1, CS3, and CS4 may have the deactivation voltage (L). Therefore, electrons generated by incident light (IL) received in the second period PR2 may move toward the second tap T2 by a hole current, such that the electrons can be captured by the second detection node DN2. In this case, the electrons captured by the second detection node DN2 in the second period PR2 may hereinafter be denoted by "Q(π)".

In a third period PR3, the third demodulation control signal CS3 may have the activation voltage (H), and each of the first, second, and fourth demodulation control signals CS1, CS2, and CS4 may have the deactivation voltage (L). Therefore, electrons generated by incident light (IL) received in the third period PR3 may move toward the third tap T3 by a hole current, such that the electrons can be captured by the third detection node DN3. In this case, the electrons captured by the third detection node DN3 in the third period PR3 may hereinafter be denoted by "Q(π/2)".

In a fourth period PR4, the fourth demodulation control signal CS4 may have the activation voltage (H), and each of the first, second, and third demodulation control signals CS1, CS2, and CS3 may have the deactivation voltage (L). Therefore, electrons generated by incident light (IL) received in the fourth period PR4 may move toward the fourth tap T4 by a hole current, such that the electrons can be captured by the fourth detection node DN4. In this case, the electrons captured by the fourth detection node DN4 in the fourth period PR4 may hereinafter be denoted by "Q(3π/2)".

Electrons generated by the incident light (IL) having a phase difference (θ) that is changed with the distance between the image sensing device ISD and the target object 1, may be captured by the first detection node DN1 in the first period PR1, may be captured by the second detection node DN2 in the second period PR2, may be captured by the third detection node DN3 in the third period PR3, and may be captured by the fourth detection node DN4 in the fourth period PR4.

In the first period PR1, the electric field control signal VS may have a voltage between the activation voltage (H) and the deactivation voltage (L) of the demodulation control signal CS1. In the second period PR2, the electric field control signal VS may have a voltage between the activation voltage (H) and the deactivation voltage (L) of the demodulation control signal CS2. In the third period PR3, the electric field control signal VS may have a voltage between the activation voltage (H) and the deactivation voltage (L) of the demodulation control signal CS3. In the fourth period PR4, the electric field control signal VS may have a voltage between the activation voltage (H) and the deactivation voltage (L) of the demodulation control signal CS4. The electric field control signal VS has a voltage between the activation voltage (H) and the deactivation voltage (L), such that a hole current gradient can be controlled. Since the hole current gradient is controlled, the hole current path may increase in length and the amount of photocharges moving along the hole current may increase.

The image sensing device based on some implementations of the disclosed technology may be configured to perform the sensing operation for each unit pixel (PX) including the sub-pixels P1, P2, P3, and P4.

Although the image sensing device based on some implementations of the disclosed technology has been disclosed centering upon the unit pixel including the sub-pixels P1, P2, P3, and P4 for convenience of description, other implementations are also possible, and the respective four first detection nodes DN1 surrounding the first control node CN1 can capture electrons generated by incident light (IL) that is incident upon different unit pixels (PXs) in the first period PR1.

In the first period PR1, the four first detection nodes DN1 arranged centering upon the first control node CN1 may capture photocharges generated by four different unit pixels that respectively include four sub-pixels P6, P7, P12, and P1.

In the second period PR2, the second detection nodes DN2 may capture electrons generated by incident light (IL) that is incident upon different unit pixels. In the third period PR3, the third detection nodes DN3 surrounding the third control node CN3 may capture electrons generated by incident light (IL) that is incident upon different unit pixels. In the fourth period PR4, the fourth detection nodes DN4 surrounding the fourth control node CN4 may capture electrons generated by incident light (IL) that is incident upon different unit pixels.

Therefore, in association with a unit pixel included in the pixel array 30, the demodulation control signal having the activation voltage may be applied to different taps located at different positions in the first to fourth periods PR1~PR4. For example, in association with the unit pixel formed by the sub-pixels P11, P12, P15, and P16, a tap to which the demodulation control signal having the activation voltage (H) is applied in the first period PR1 may be the first tap T1, a tap to which the demodulation control signal having the activation voltage (H) is applied in the second period PR2 may be set to the tenth tap T10, a tap to which the demodulation control signal having the activation voltage (H) is applied in the third period PR3 may be set to the sixth tap T6, and a tap to which the demodulation control signal having the activation voltage (H) is applied in the fourth period PR4 may be set to the fourth tap T4.

Each unit pixel (PX) may include another tap configured to receive the electric field control signal VS. For example, in association with the unit pixel (PX) formed by the sub-pixels P11, P12, P15, and P16, a tap to which the electric field control signal VS is applied in each of the first to fourth periods PR1, PR2, PR3, and PR4 may be set to the eighth tap T8.

A first tap to which the demodulation control signal CS1 having the activation voltage (H) is applied in the first period PR1 with respect to a boundary between the unit pixels, a second tap to which the demodulation control signal CS2 having the activation voltage (H) is applied in the second period PR2 with respect to a boundary between the unit pixels, a third tap to which the demodulation control signal CS3 having the activation voltage (H) is applied in the third period PR3 with respect to a boundary between the unit pixels, and a fourth tap to which the demodulation control signal CS4 having the activation voltage (H) is applied in the fourth period PR4 with respect to a boundary between the unit pixels may be arranged symmetrical to one another. Such symmetrical arrangement of the first, second, third, and fourth taps respectively used in the first, second, third, and fourth periods PR1, PR2, PR3, and PR4 may also be applied to the entire pixel array 30 as needed.

In one unit pixel (PX), a time period to which any one of the taps corresponds may also be changed without being fixed.

A phase difference (θ) may be calculated using the captured electrons Q(0), Q(π/2), Q(π), and Q(3π/2).

Photocharges generated by incident light (IL) that is incident upon the unit pixel (PX) may be distributed to the first period PR1, the second period PR2, the third period PR3, and the fourth period PR4, such that the photocharges may be divisionally captured in the first to fourth periods PR1~PR4.

The first demodulation control signal CS1 for acquiring electrons Q(0) may have a phase difference of 90°, the second demodulation control signal CS2 for acquiring electrons Q(π) may have a phase difference of 90°, the third demodulation control signal CS3 for acquiring electrons Q(π/2) may have a phase difference of 90°, and the fourth demodulation control signal CS4 for acquiring electrons Q(3π/2) may have a phase difference of 90°. As a result, the image processor (not shown) may calculate a phase difference based on first image data, second image data, third image data, and fourth image data respectively received from the pixels P1, P2, P3, and P4 included in the unit pixel (PX), and may calculate the distance between the image sensing device ISD and the target object 1 using the calculated phase difference. Here, the first image data may correspond to the electrons Q(0) captured in the first period PR1, the second image data may correspond to the electrons Q(π) in the second period PR2, the third image data may correspond to the electrons Q(π/2) in the third period PR3, and the fourth image data may correspond to the electrons Q(3π/2) in the fourth period PR4.

Figure 10:
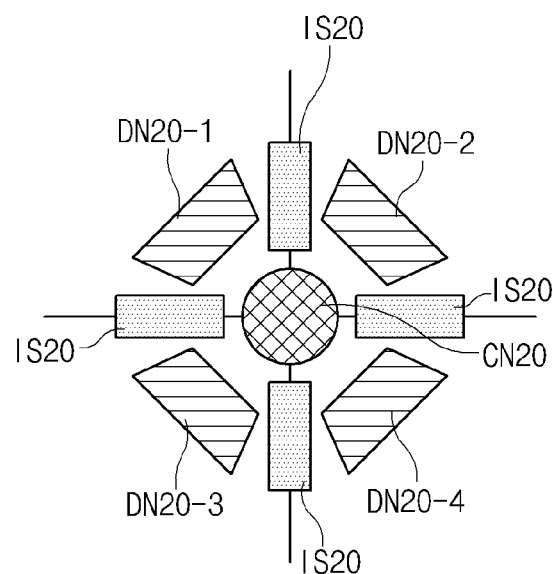
FIGS. 10 and 11 are schematic diagrams illustrating other examples of first to fourth taps included in the pixel array shown in FIG. 1 based on some implementations of the disclosed technology.
Figure 11:
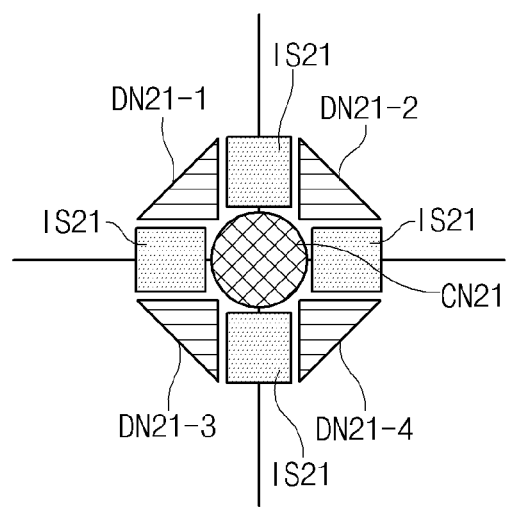

FIGS. 10 and 11 are schematic diagrams illustrating other examples of the first to fourth taps included in the pixel array shown in FIG. 1 based on some implementations of the disclosed technology.

Referring to FIGS. 10 and 11, the tap configured to have the control node (e.g., CN20) and the detection nodes (e.g., DN20-1~DN20-4) may be any one of the first to fourth taps included in the pixel array 30. In FIGS. 10 and 11, the remaining parts of the structures and operations of the control nodes and the detection nodes shown in FIGS. 10 and 11 other than some characteristics different from those of FIG. 2 may be substantially identical to those of the control nodes and the detection nodes shown in FIG. 2, and as such redundant description thereof will herein be omitted for brevity. Therefore, the different characteristics of the structures and operations of the control nodes and the detection nodes shown in FIGS. 10 and 11 will hereinafter be mainly described as compared to those of FIG. 2 for convenience of description.

In FIGS. 10 and 11, each of the control nodes CN20 and CN21 may be formed in a circular shape, and the detection nodes of the control node CN20 may be different in shape from the detection nodes of the control node CN21 as needed.

In FIG. 10, each of the detection nodes DN20-1~DN20-4 surrounding the control node CN20 may be formed in a trapezoidal shape in which one side facing the control node CN10 has a smaller width than the other side located far from the control node.

In FIG. 11, each of the detection nodes DN21_1~DN21-4 surrounding the control node CN21 may be formed in a right-angled triangle shape in which an oblique side is located far from the control node CN21 and a vertex point corresponding to a right angle may be located closer to the control node CN21.

Although the structure shown in FIG. 10 is different in shape from the structure shown in FIG. 11, the reason why FIG. 10 and FIG. 11 have different shapes is to allow the corresponding control node to be surrounded by as large the detection nodes as possible. As a result, the detection nodes having the above-mentioned shapes can more easily capture signal carriers that are moving along a hole current formed by the control node.

At least one isolation region IS20 may be disposed between the contiguous or adjacent detection nodes in FIG. 10, and at least one isolation region IS21 may be disposed between the contiguous or adjacent detection nodes in FIG. 11.

Since the isolation regions IS20 and IS21 are disposed as shown in FIGS. 10 and 11, crosstalk of photocharges generated in the contiguous or adjacent sub-pixels can be prevented from occurring in the photocharge detection modes of the detection nodes DN20-1~DN20-4 and DN21_1~DN21-4. In FIG. 10, the isolation regions IS20 may be formed as a doped region that is opposite in dopant type to the detection nodes DN20-1~DN20-4. In FIG. 11, the isolation regions IS2 may be formed as a doped region doped with impurities that are opposite in dopant type to those of the detection nodes DN21_1~DN21-4. In FIG. 10, when the substrate is implemented as the P-type substrate, the detection nodes DN20-1~DN20-4 can be isolated from each other through the Pt-type doped region. In FIG. 11, when the substrate is implemented as the P-type substrate, the detection nodes DN21_1~DN21-4 can be isolated from each other through the Pt-type doped region.

In addition to the above operation for isolating the detection nodes from each other through the doped region, at least one insulation layer may be disposed between the control node CN20 and each of the detection nodes DN20-1~DN20-4 contiguous or adjacent to the control node CN20 as shown in FIG. 10, and at least one insulation layer may be disposed between the control node CN21 and each of the detection nodes DN21_1~DN21-4 contiguous or adjacent to the control node CN21 as shown in FIG. 11, such that the detection nodes DN20-1~DN20-4 shown in FIG. 10 can be isolated from each other and the detection nodes DN21_1~DN21-4 shown in FIG. 11 can be isolated from each other.

In more detail, the control node CN20 and each of the detection nodes DN20-1~DN20-4 contiguous or adjacent to the control node CN20 can be isolated from each other by the insulation layers that are formed by gapfilling a trench formed by a shallow trench isolation (STI) process with insulation materials, as shown in FIG. 10. The control node CN21 and each of the detection nodes DN21_1~DN21-4 contiguous or adjacent to the control node CN21 can be isolated from each other by the insulation layers that are formed by gapfilling a trench formed by a Shallow Trench Isolation (STI) process with insulation materials.

Although FIG. 10 has exemplarily disclosed the shape and arrangement formats of the control node CN20 and the detection nodes DN20-1~DN20-4 and FIG. 11 has exemplarily disclosed the shape and arrangement formats of the control node CN21 and the detection nodes DN21_1~DN21-4 for convenience of description, the scope or spirit of the disclosed technology is not limited thereto, and other implementations are also possible.

Figure 12:
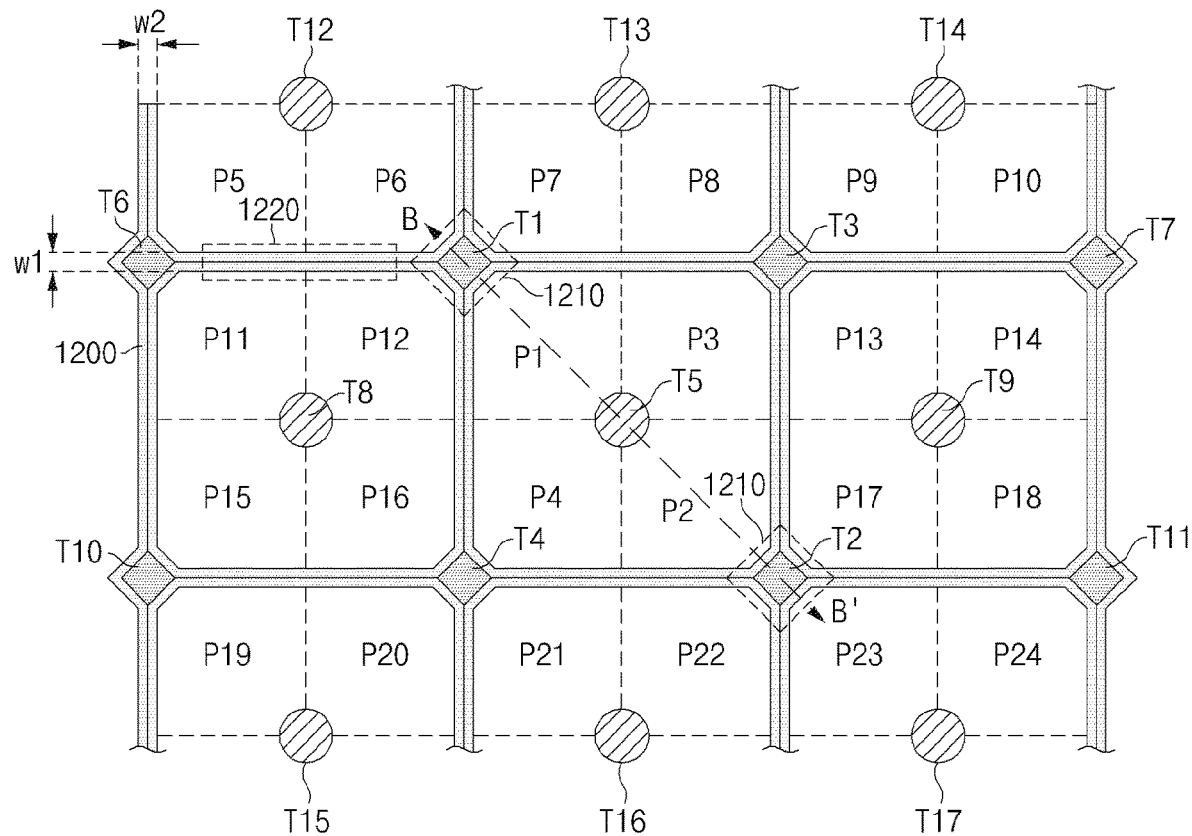
FIG. 12 is a schematic diagram illustrating an example of a grid structure disposed in the pixel array shown in FIG. 2 based on some implementations of the disclosed technology.

FIG. 12 is a schematic diagram illustrating an example of a grid structure 1200 disposed in the pixel array 30 shown in FIG. 2 based on some implementations of the disclosed technology.

In more detail, FIG. 12 illustrates an example of the grid structure 1200 disposed in the pixel array 30 shown in FIG. 2.

For convenience of description and better understanding of the disclosed technology, an outer-wall shape of each of the first to fourth taps (e.g., T1, T2, T3, and T4) may be simplified such that each of the first to fourth taps T1~T4 can be formed in a diamond shape. In addition, the fifth tap T5 (e.g., T5) may be formed in a circular shape.

The grid structure 1200 may prevent light from flowing into the substrate by absorbing or reflecting light incident upon the pixel array 30. In this case, the grid structure 1200 may include at least one of metal (e.g., tungsten W) having a high light absorption rate and metal (e.g., aluminum Al) having high light reflectivity.

The grid structure 1200 may be formed to extend along a boundary between the contiguous or adjacent unit pixels (PXs). In other words, the grid structure 1200 may include a first region that extends in a horizontal direction (or a row direction) along a boundary between the unit pixels (PXs) vertically contiguous or adjacent to each other, and a second region that extends in a vertical direction (or a column direction) along a boundary between the unit pixels (PXs) horizontally contiguous or adjacent to each other.

Since electrons generated by incident light applied around or near a boundary between the contiguous or adjacent unit pixels (PXs) are moved and captured by a hole current of the contiguous or adjacent pixel other than the pixel receiving the incident light, there is a high possibility of generating crosstalk that may act as noise in the pixel signal.

In addition, incident light directly applied to the respective positions of the first to fourth taps T1, T2, T3, and T4 may be processed by photoelectric conversion within regions contiguous or adjacent to the detection nodes of the first to fourth taps T1, T2, T3, and T4, resulting in generation of electrons. In addition, regardless of whether or not the hole current has occurred, the electrons may be captured by nearby detection nodes, such that the captured electrons may act as noise in the pixel signal.

In order to prevent such noise, the grid structure 1200 may include a tap guard region 1210 and a check region 1220 that are disposed over the first to fourth taps T1, T2, T3, and T4.

The tap guard region 1210 may be formed to have a shape and region that correspond to each of the first to fourth taps T1, T2, T3, and T4, such that the tap guard region 1210 may completely cover each of the first to fourth taps T1, T2, T3, and T4.

The check region 1220 may extend long along a boundary between the unit pixels (PXs) contiguous or adjacent to each other. The check region 1220 that extends in a horizontal direction (or a row direction) along a boundary between the unit pixels (PXs) vertically contiguous or adjacent to each other may have a first width W1. The check region 1220 that extends in a vertical direction (or a column direction) along a boundary between the pixels horizontally contiguous or adjacent to each other may have a second width W2.

In this case, the first width W1 may be a value that is less than a vertical length of each of the first to fourth taps T1~T4, and the second width W2 may be a value that is less than a horizontal length of each of the first to fourth taps T1~T4. The first width W1 and the second width W2 of the check region 1220 may be determined experimentally to reduce crosstalk and to increase light reception efficiency.

The grid structure 1200 may reduce the amount of noise generated not only by light incident around or near the contiguous or adjacent unit pixels (PXs), but also by light directly applied to the respective positions of the first to fourth taps T1~T4, and at the same time may optimize light reception efficiency of each unit pixel (PX).

Figure 13:
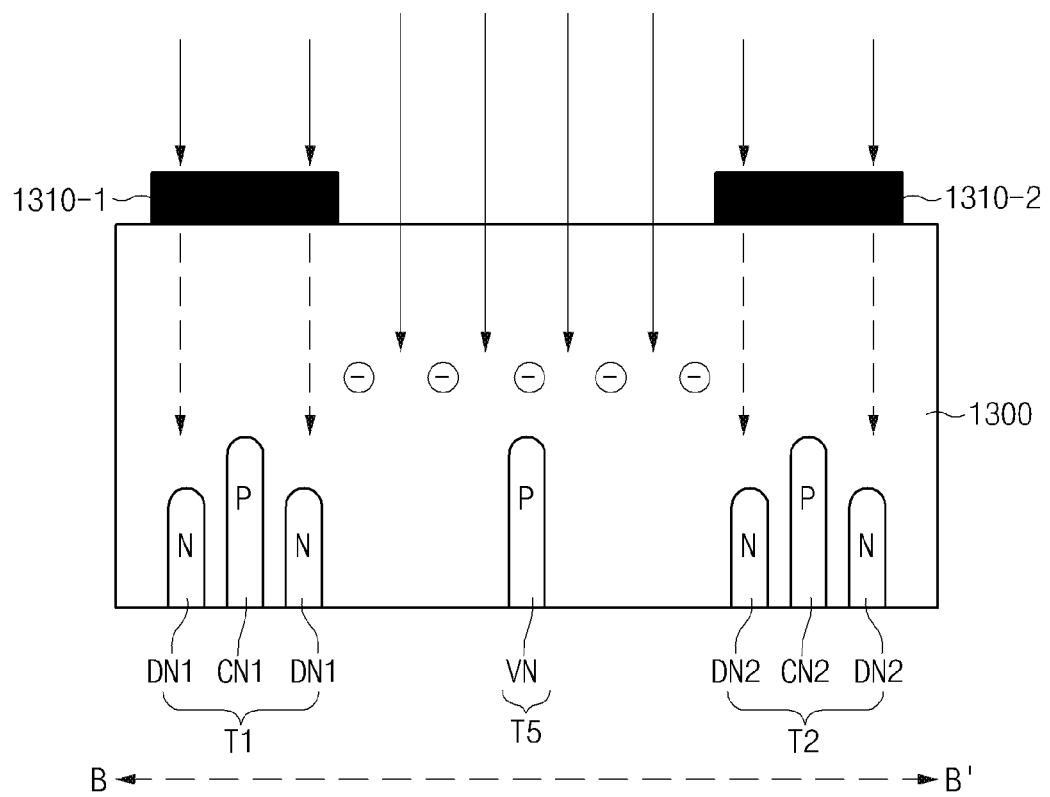
FIG. 13 is a conceptual diagram illustrating an example of the grid structure shown in FIG. 12 based on some implementations of the disclosed technology.

FIG. 13 is a conceptual diagram illustrating an example of the grid structure 1200 shown in FIG. 12 based on some implementations of the disclosed technology. In more detail, FIG. 13 is a cross-sectional view illustrating an example of the pixel array taken along the second cutting line B-B' shown in FIG. 12.

Referring to FIG. 13, a substrate 1300 may include a first surface upon which light is incident, and a second surface facing or opposite to the first surface.

The substrate 1300 may include a first tap T1 disposed at a left side therein and a second tap T2 disposed at a right side therein. Here, the first tap T1 may be contiguous or adjacent to the second surface at the left side of the substrate 1300, and the second tap T2 may be contiguous or adjacent to the second surface at the right side of the substrate 1300. In addition, a fifth tap T5 may be disposed at the center portion between the first tap T1 and the second tap T2.

A first tap guard region 1310-1 may be disposed to overlap with the first tap T1 at the first surface of the substrate 1300.

A second tap guard region 1310-2 may be disposed to overlap with the second tap T2 at the first surface of the substrate 1300.

Due to the first tap guard region 1310-1 and the second tap guard region 1310-2, incident light directly applied to the respective positions of the detection nodes DN1 and DN2 can be prevented as denoted by dotted lines shown in FIG. 13, and electrons generated by light incident through an opening other than the first and second guard regions 1310-1 and 1310-2 may contribute to the pixel signals of the sub-pixels P1 and P2.

Figure 14:
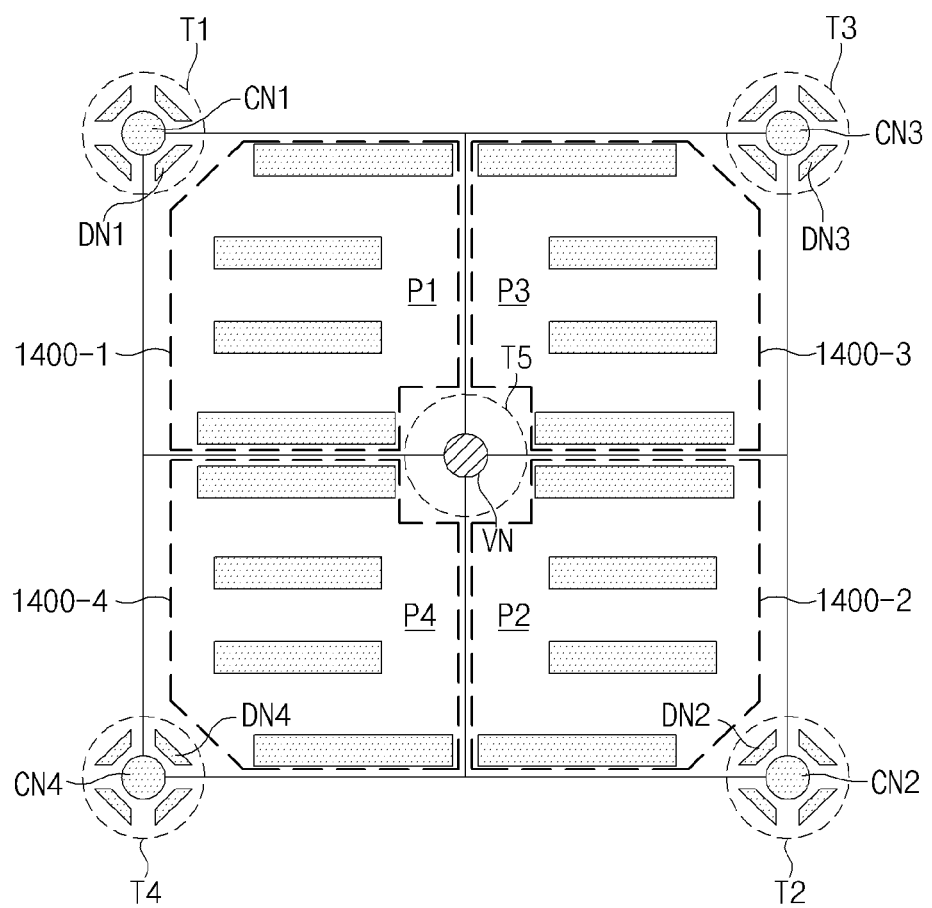
FIG. 14 is a schematic diagram illustrating an example of a pixel transistor region disposed in the pixel array shown in FIG. 2 based on some implementations of the disclosed technology.

FIG. 14 is a schematic diagram illustrating an example of a pixel transistor region disposed in the pixel array 30 shown in FIG. 2 based on some implementations of the disclosed technology.

Although FIG. 14 exemplarily illustrates the unit pixel (PX) including the sub-pixels P1, P2, P3, and P4 for convenience of description, the scope or spirit of the disclosed technology is not limited thereto, and the remaining sub-pixels P5~P24 other than the sub-pixels P1~P4 may also have substantially the same structures as those of the sub-pixels P1~P4 as necessary.

The sub-pixel P1 may include a first pixel transistor region 1400-1. The sub-pixel P2 may include a second pixel transistor region 1400-2. The sub-pixel P3 may include a third pixel transistor region 1400-3. The sub-pixel P4 may include a fourth pixel transistor region 1400-4.

The first pixel transistor region 1400-1 may include a plurality of transistors to process photocharges captured by the first detection node DN1 of the first tap T1.

The second pixel transistor region 1400-2 may include a plurality of transistors to process photocharges captured by the second detection node DN2 of the second tap T2. The third pixel transistor region 1400-3 may include a plurality of transistors to process photocharges captured by the third detection node DN3 of the third tap T3. The fourth pixel transistor region 1400-4 may include a plurality of transistors to process photocharges captured by the fourth detection node DN4 of the fourth tap T4.

The respective pixel transistor regions of the unit pixel (PX) may be symmetrically arranged with respect to the fifth tap T5.

Due to such symmetrical arrangement of the pixel transistor regions, resistance components (e.g., the length of a metal line, parasitic capacitance, etc.) present between the first to fourth taps T1~T4 and the pixel transistor regions 1400-1_1400-4 may be equalized, and noise components included in the pixel signals may also be substantially equalized, such that such noise components can be easily removed through image information processing.

Although not shown in FIG. 14, the pixel transistor regions may be symmetrically arranged with respect to a boundary between the unit pixels (PXs).

In more detail, a unit pixel included in the pixel array 30 may be symmetrical in structure to the contiguous or adjacent unit pixel with respect to the boundary between the unit pixel and the contiguous unit pixel.

Since the contiguous unit pixels are symmetrically arranged with respect to the boundary between the contiguous unit pixels, resistance components can be equalized in the entire pixel array 30, such that noise components included in the pixel signals are also substantially equalized in the entire pixel array 30 and the resultant noise components can be easily removed by an image processor (not shown) or the like.

As is apparent from the above description, the image sensing device provided with pixels including an electron detection structure based on some implementations of the disclosed technology can allow unit pixels to receive an electric field control signal, and can control flow of a hole current using the electric field control signal, resulting in implementation of higher electron detection efficiency and higher detection speed.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein. In addition, claims that are not explicitly presented in the appended claims may be presented in combination as an embodiment or included as a new claim by a subsequent amendment after the application is filed.

Although a number of illustrative embodiments have been described, it should be understood that numerous other modifications and embodiments can be devised based on what is described and/or illustrated in this patent document.

What is claimed is:

1. An image sensing device comprising:
a pixel array of unit pixels, each unit pixel structured to respond to incident light to produce photocharges indicative of detected incident light and including different photosensing sub-pixels at different locations within the unit pixel to detect incident light;
different detection structures formed at peripheral locations of the different photosensing sub-pixels of the unit pixel, respectively, and configured to receive the photocharges that are generated by the different photosensing sub-pixels and are carried by a current in the unit pixel;
a unit pixel voltage node located at a center portion of the unit pixel and electrically coupled to electrically bias an electrical potential of the different photosensing sub-pixels;
a control circuit coupled to the different detection structures of the unit pixel to supply sub-pixel detection control signals to the different detection structures of the unit pixel, respectively and coupled to the unit pixel voltage node to supply an electrical field control signal,
wherein each of the detection structures formed at peripheral locations of the different photosensing sub-pixels of the unit pixel includes 1) a control node to receive a corresponding sub-pixel detection control signal for the unit pixel, and 2) a detection node adjacent to the control node, and
wherein the control circuit is structured to cause each sub-pixel detection control signal to have either an activation voltage or a deactivation voltage.

2. The image sensing device according to claim 1, wherein:
the electric field control signal has a voltage that is between the deactivation voltage and the activation voltage.

3. The image sensing device according to claim 2, wherein:
the voltage of the electric field control signal is an average value of the activation voltage and the deactivation voltage.

4. The image sensing device according to claim 1, further includes:
a light source to produce illumination light to illuminate a target object to be imaged by the pixel array by detecting returned light from the target object under illumination by the illumination light,
wherein:
the pixel array of unit pixels includes a first unit pixel including four photosensing sub-pixels that are arranged in a 2×2 matrix array,
the control circuit is coupled to the light source to apply a light modulation signal to modulate the illumination light and is further structured to apply (1) a first sub-pixel detection control signal to the detection structure for a first sub pixel of the first unit pixel to have a same phase as the light modulation signal for generating modulated light applied to the target object; (2) a second sub-pixel detection control signal to the detection structure for a second sub pixel of the first unit pixel to have a phase difference of 180° with respect to the light modulation signal; (3) a third sub-pixel detection control signal to the detection structure for a third sub pixel of the first unit pixel to have a phase difference of 90° with respect to the light modulation signal; (4)
a fourth sub-pixel detection control signal to the detection structure for a fourth sub pixel of the first unit pixel to have a phase difference of 270° with respect to the light modulation signal.

5. The image sensing device according to claim 1, wherein:
each control node has a circular shape; and
each detection node has a shape that is one of a trapezoid, a rectangle, or a triangle.

6. The image sensing device according to claim 1, wherein the different detection structures include a first detection structure that further comprises:
an additional detection node adjacent to the detection node; and
an isolation region disposed between the detection node and the additional detection node.

7. The image sensing device according to claim 6, wherein:
the isolation region is doped with impurities having a dopant type opposite to a dopant type of the detection node.

8. The image sensing device according to claim 1, further comprising:
a grid structure extending along a boundary between adjacent sub-pixels included in the unit pixel, and configured to reflect or absorb the incident light.

9. The image sensing device according to claim 8, wherein:

a width of the grid structure in a region extending along the boundary between the adjacent sub-pixels is less than a horizontal length and a vertical length of the detection structure.

10. The image sensing device according to claim 8, wherein the grid structure includes:
a region extending to overlap with the detection structures.

11. The image sensing device according to claim 1, wherein each photosensing sub-pixel of the unit pixel includes:
a pixel transistor region including transistors for processing the photocharges captured by the detection node for the photosensing sub-pixel, and
wherein different pixel transistor regions of the photosensing sub-pixels of the unit pixel are symmetrically arranged with respect to a boundary between the sub-pixels.

12. An image sensing device comprising:
a unit pixel including sub pixels and having sides and vertex points connecting two adjacent sides, the unit pixel configured to generate photocharges in response to a reception of incident light;
control nodes disposed at the vertex points of the unit pixel and configured to receive first control signals that generate a hole current in a substrate such that the photocharges move along a flow of the hole current;
a voltage reception node disposed at a center portion of the unit pixel and configured to receive a second control signal that controls the flow of the hole current;
detection nodes respectively located around the control nodes and configured to capture the photocharges, and
wherein the first control signals correspond to demodulation control signals having either an activation voltage or a deactivation voltage.

13. The image sensing device according to claim 12, wherein the unit pixel including sub pixels includes 4 sub pixels that are arranged in a 2×2 matrix array.

14. The image sensing device according to claim 12, wherein:
the second control signal corresponds to an electric field control signal that has a value between the activation voltage and the deactivation voltage.

15. The image sensing device of claim 14, wherein the value is an average value of the activation voltage and the deactivation voltage.

16. The image sensing device of claim 12, wherein each control node has a circular shape, and each detection node has a shape that is one of a trapezoid, a rectangle, or a triangle.

17. The image sensing device of claim 12, wherein an isolation region is disposed between adjacent detection nodes.

18. The image sensing device of claim 17, wherein the isolation region is doped with impurities having a dopant type opposite to a dopant type of the adjacent detection nodes.

19. The image sensing device of claim 12, wherein each sub pixel of the unit pixel includes:
a pixel transistor region including transistors for processing the photocharges.

* * * * *